United States Patent
Xie et al.

(10) Patent No.: US 9,337,050 B1
(45) Date of Patent: May 10, 2016

(54) METHODS OF FORMING FINS FOR FINFET SEMICONDUCTOR DEVICES AND THE SELECTIVE REMOVAL OF SUCH FINS

(71) Applicants: GLOBALFOUNDRIES Inc., Grand Cayman (KY); International Business Machines Corporation, Armonk, NY (US)

(72) Inventors: Ruilong Xie, Niskayuna, NY (US); Xiuyu Cai, Niskayuna, NY (US); Kangguo Cheng, Schenectady, NY (US)

(73) Assignees: GLOBALFOUNDRIES Inc., Grand Cayman (KY); International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/675,045

(22) Filed: Mar. 31, 2015

Related U.S. Application Data

(60) Provisional application No. 62/088,215, filed on Dec. 5, 2014.

(51) Int. Cl.
*H01L 21/311* (2006.01)
*H01L 21/308* (2006.01)
*H01L 21/8234* (2006.01)

(52) U.S. Cl.
CPC .... *H01L 21/3086* (2013.01); *H01L 21/823412* (2013.01); *H01L 21/823431* (2013.01)

(58) Field of Classification Search
CPC .................................................. H01L 21/3086
USPC ............................................ 438/696; 216/46
See application file for complete search history.

(56) References Cited

U.S. PATENT DOCUMENTS

2008/0057692 A1* 3/2008 Wells .................. H01L 21/0337 438/597

* cited by examiner

*Primary Examiner* — Roberts Culbert
(74) *Attorney, Agent, or Firm* — Amerson Law Firm, PLLC

(57) ABSTRACT

One illustrative method disclosed herein includes, among other things, forming an inverted, generally T-shaped mandrel feature having a base mandrel structure and a substantially vertically oriented fin mandrel structure, the base mandrel structure having a lateral width that is greater than a lateral width of the fin mandrel structure, forming a sidewall spacer adjacent the sidewalls of the base mandrel structure and the fin mandrel structure, performing at least one etching process to remove portions of the inverted, generally T-shaped mandrel feature not covered by a sidewall spacer, wherein, after the etching process is completed, the sidewall spacers and remaining portions of the mandrel feature, collectively, define a fin pattern, and performing at least one additional process operation to form a plurality of fins in the substrate that correspond to the fin pattern.

29 Claims, 18 Drawing Sheets

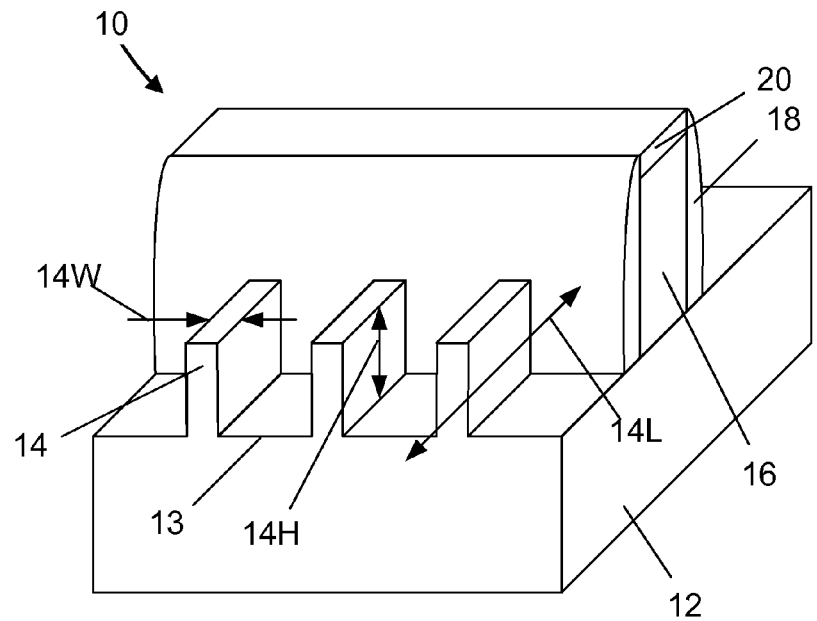
Figure 1A (Prior Art)
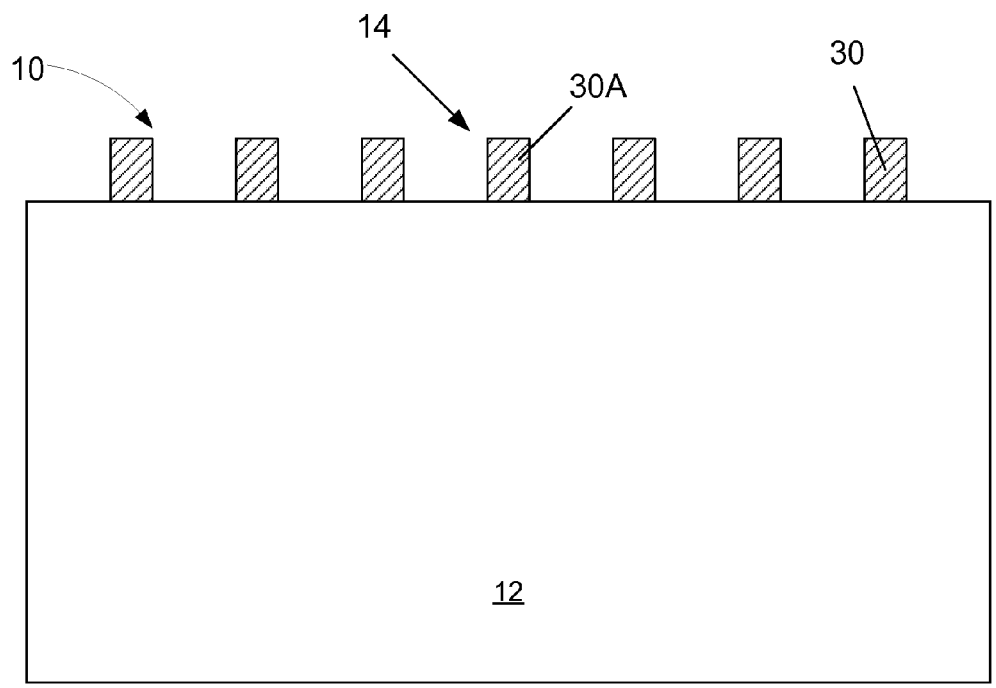
(Prior Art) Figure 1B

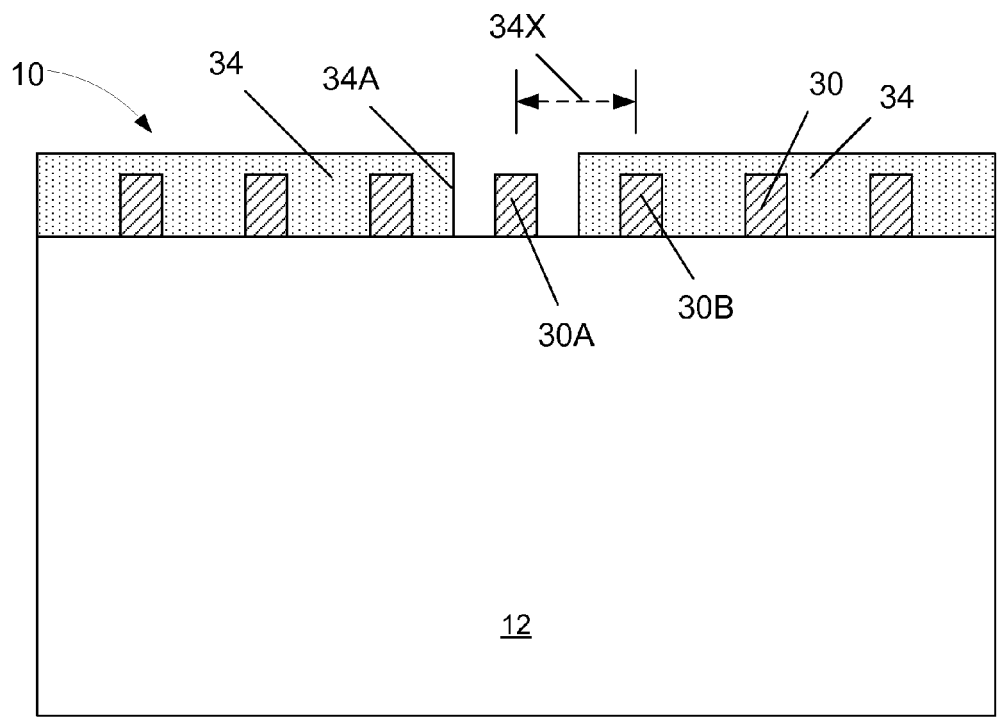
(Prior Art) Figure 1C
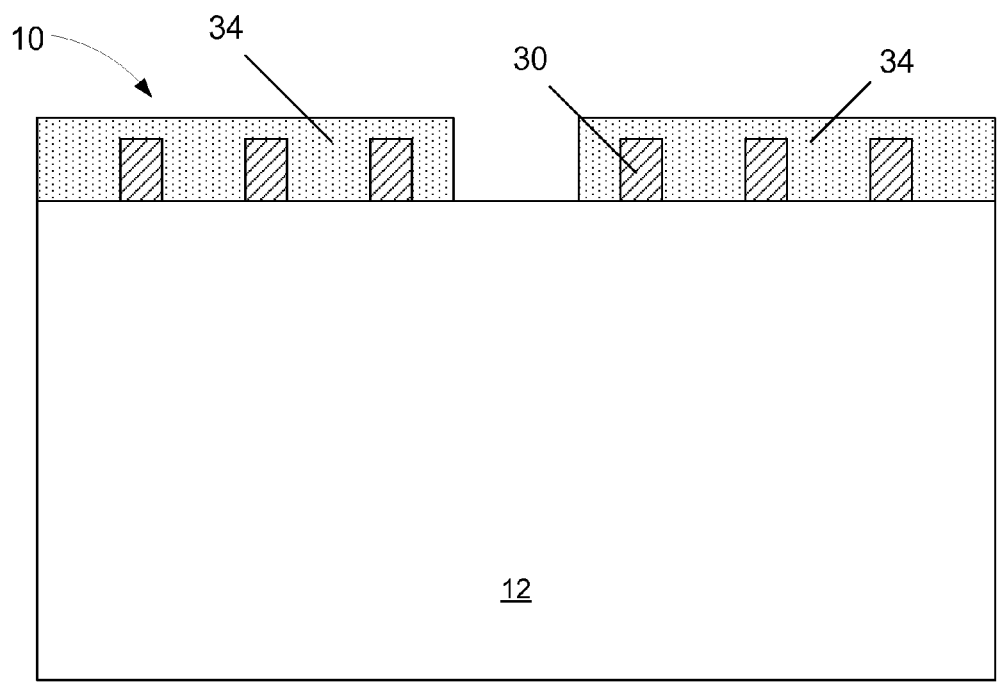
(Prior Art) Figure 1D

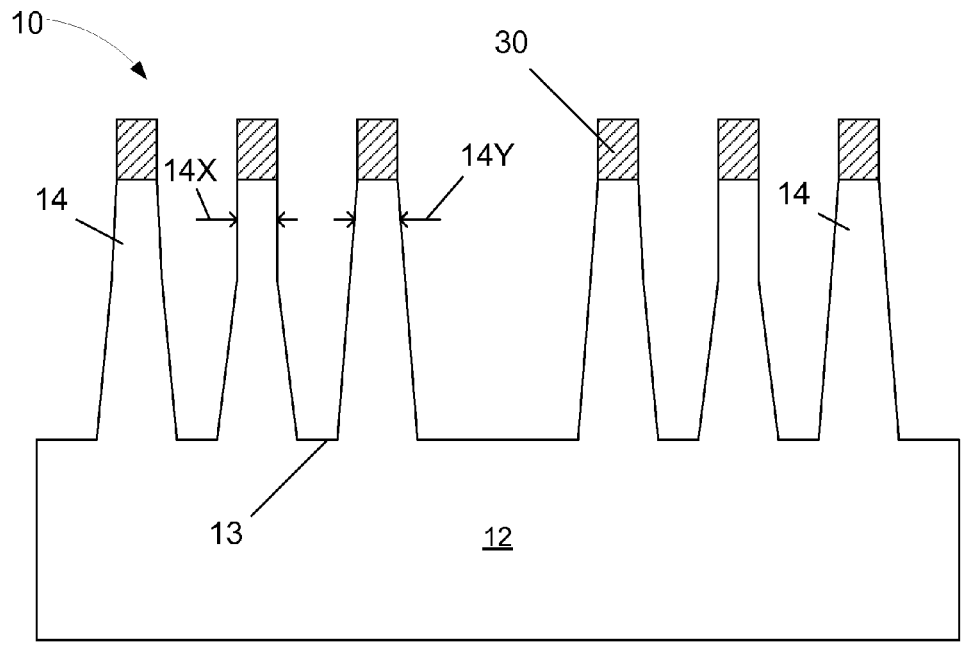
(Prior Art) Figure 1E
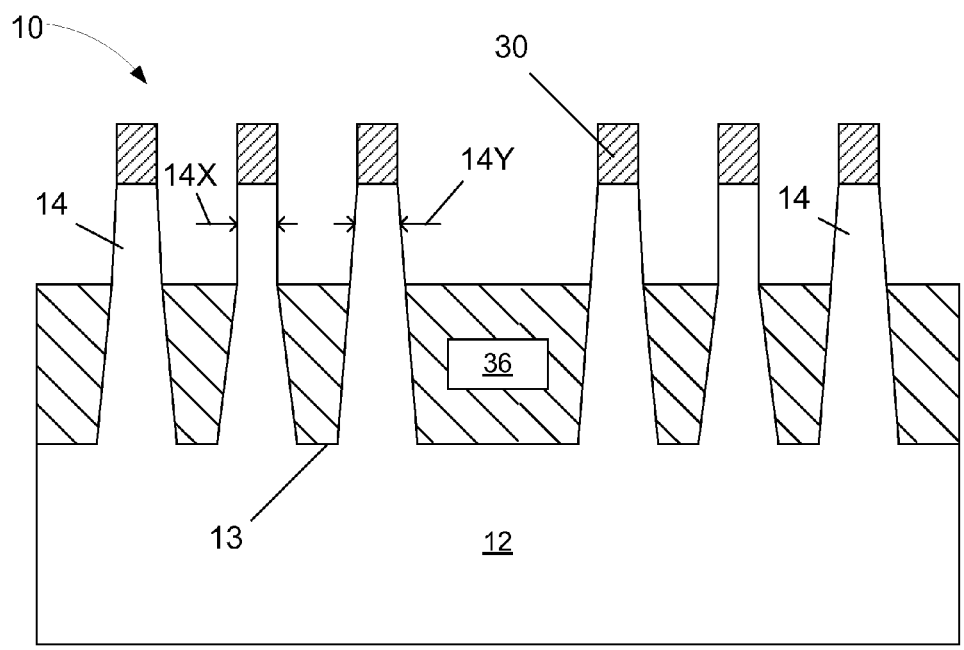
(Prior Art) Figure 1F

METHODS OF FORMING FINS FOR FINFET SEMICONDUCTOR DEVICES AND THE SELECTIVE REMOVAL OF SUCH FINS

BACKGROUND OF THE INVENTION

1. Field of the Invention

Generally, the present disclosure relates to the manufacture of semiconductor devices, and, more specifically, to various methods of forming fins for FinFET semiconductor devices and the selective removal of some of the fins.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

FIG. 1A is a perspective view of an illustrative prior art FinFET semiconductor device 10 that is formed above a semiconductor substrate 12 that will be referenced so as to explain, at a very high level, some basic features of a traditional FinFET device. In this example, the FinFET device 10 includes three illustrative fins 14, a gate structure 16, sidewall spacers 18 and a gate cap 20. The fins 14 are formed by etching a plurality of trenches 13 into the substrate 12. The gate structure 16 is typically comprised of a layer of insulating material (not separately shown), e.g., a layer of high-k insulating material or silicon dioxide, and one or more conductive material layers (e.g., metal and/or polysilicon) that serve as the gate electrode for the device 10. The fins 14 have a three-dimensional configuration: a height 14H, a width 14W and an axial length 14L. The axial length 14L corresponds to the direction of current travel, i.e., the gate length (GL) of the device 10 when it is operational. The portions of the fins 14 covered by the gate structure 16 is the channel region of the FinFET device 10. In a conventional process flow, the portions of the fins 14 that are positioned outside of the spacers 18, i.e., in the source/drain regions of the device 10, may be increased in size or even merged together (a situation not shown in FIG. 1A) by performing one or more epitaxial growth processes to form additional semiconductor material on the portions of the fins 14 in the source/drain region.

Both planar transistor devices and FinFET transistor devices have an isolation structure, e.g., a shallow trench isolation structure that is formed in the semiconducting substrate around the device so as to electrically isolate the transistor device. Traditionally, isolation structures were always the first structure that was formed when manufacturing semiconductor devices. The isolation structures were formed by etching the trenches for the isolation structures into the substrate and thereafter filling the trenches with the desired insulating material, e.g., silicon dioxide. After the isolation structures were formed, various process operations were performed to manufacture the transistor devices. In the case of a FinFET device, this involved masking the previously formed isolation structure and etching additional trenches into the substrate to thereby define the fins. As FinFET devices have been scaled (i.e., reduced in physical size) to meet ever increasing performance and size requirements, the width 14W of the fins 14 has become very small, e.g., 6-12 nm, and the fin pitch has also been significantly decreased, e.g., the fin pitch may be on the order of about 30-60 nm. As the dimensions of the fins 14 became smaller, problems arose with manufacturing the isolation structures before the fins 14 were formed. As one example, trying to accurately define very small fins in regions that were separated by relatively large isolation regions was difficult due to the non-uniform spacing between various structures on the substrate.

Various techniques have been employed to try to overcome the above-mentioned problems. One manufacturing technique involves initially forming trenches 13 in the substrate 12 to define multiple "fins" that extend across the substrate 12, and thereafter removing some of the fins 14 (or portions thereof) where larger isolation structures will be formed. Using this type of manufacturing approach, better accuracy and repeatability may be achieved in forming the fins 14 to very small dimensions due to the more uniform etching environment in which the etching process that forms the trenches 13 is performed.

As indicated above, after the trenches 13 are formed, some portion of the fins 14 must be removed to create room for or define the spaces where isolation regions will ultimately be formed. There are two commonly employed techniques for accomplishing the goal of removing the desired number and portions of the fins 14. One such removal process is typically referred to as "Fins-cut-First," as will be described with reference to FIGS. 1B-1E. FIG. 1B depicts the device 10 after a patterned hard mask layer 30, e.g., comprised of a patterned layer of silicon nitride (pad-nitride) and a patterned layer of silicon dioxide (pad-oxide) was formed above the substrate 12 in accordance with the desired fin pattern and pitch. In the depicted example, only a single fin will be removed, i.e., the fin 14 corresponding to the feature 30A, to make room for the isolation region. However, as will be recognized by those skilled in the art, depending upon the desired final size of the isolation region, more than one fin may be removed. Of course, the entire axial length 14L of the fin 14 need not be removed, but it may be in some applications.

FIG. 1C depicts the device 10 after a patterned masking layer 34, e.g., a patterned layer of photoresist, was formed above the patterned hard mask layer 30. The patterned masking layer 34 has an opening 34A that exposes the feature 30A for removal.

FIG. 1D depicts the device 10 after an etching process was performed through the patterned masking layer 34 so as to remove the exposed feature 30A of the patterned hard mask layer 30.

FIG. 1E depicts the device 10 after the patterned masking layer 34 was removed and after an etching process was performed through the patterned hard mask layer 30 (without the feature 30A) so as to define full-depth trenches 13 in the substrate 12 that define the fins 14. Due to the removal of the feature 30A, this etching process removes the portions of the substrate 12 that would have otherwise formed a fin 14 in the area under the feature 30A. One problem with the "fins-cut-first" approach is that it inevitably causes different fin sizes, i.e., the dimensions 14X and 14Y are different. This is especially true between fins 14 inside an array of fins and the fins at the edge of the active region that is close to the isolation region. These dimensional variations occur due to etch loading effects wherein there are different etch rates and etch profiles due to differing patterning densities, pitch, etc. Another problem with the "fins-cut-first" approach is with potential misalignment of the opening 34A in the masking layer 34 (See FIG. 1C). If the opening 34A is perfectly aligned (as depicted in FIG. 1C) then only the feature 30A will be removed from the patterned hard mask layer 34. However, if the opening 34A is misaligned, as depicted by the dashed line opening 34X that shifted to the right, then portions of both the features 30A and 30B will be etched, thereby resulting in incomplete removal of the fin corresponding to the feature 30A (the fin that is desired to be removed) and partial removal of the fin corresponding to the feature 30B (a fin that was not intended to be removed).

FIG. 1F depicts the device 10 after several process operations were performed. First, a layer of insulating material 36, such as silicon dioxide, was formed so as to overfill the trenches 13. A chemical mechanical polishing (CMP) process was then performed to planarize the upper surface of the insulating material 36 with the top of the patterned hard mask 30. Thereafter, an etch-back process was performed to recess the layer of insulating material 36 between the fins 14 and thereby expose the upper portions of the fins 14, which corresponds to the final fin height of the fins 14. At this point in the process, the patterned hard mask 30 may or may not be thereafter removed. Next, the gate structure (not shown) of the device 10 may be formed using either gate-first or gate-last manufacturing techniques.

One technique that has been employed to create the initial patterned hard mask 30 is generally known as "sidewall image transfer" (SIT). In the SIT technique, patterned mandrel features are formed above the substrate, and sidewall spacers are then formed adjacent patterned mandrel features. Thereafter, the mandrel features are removed leaving the sidewall spacers which constitute the pattern for the hard mask layer. The SIT process can be performed as a single patterning process (for fin pitches of about 40 nm or greater) or essentially repeated using a so-called memorization layer to repeat the process for fins having a pitch less than 40 nm, e.g., less than 32 nm. In this latter process, the process would involve forming a first set of spacers against a first group of mandrel features, removing the first group of mandrel features, transferring the pattern of the first set of spacers to an underlying memorization layer, removing the first set of spacers, forming a second set of spacers adjacent the features of the patterned memorization layer, which are treated as a second group of mandrel features, removing the second group of mandrel features so as to define a second group of spacers that corresponds to the desired fin pattern and desired fin pitch of the fins, and etching the fins into the substrate using the fin pattern defined by the second group of spacers. Whether single or double SIT techniques are involved, the net result is the formation of a single layer of spacers that correspond to the fin pattern and fin pitch of the fins to be formed in the substrate.

The present disclosure is directed to various methods of forming fins for FinFET semiconductor devices and the selective removal of some of the fins that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming fins for FinFET semiconductor devices and the selective removal of some of the fins. One illustrative method disclosed herein includes, among other things, forming an inverted, generally T-shaped mandrel feature above a semiconductor substrate, the mandrel feature having a base mandrel structure and a substantially vertically oriented fin mandrel structure located above the base mandrel structure, the base mandrel structure having a lateral width that is greater than a lateral width of the fin mandrel structure, forming a sidewall spacer adjacent substantially vertically oriented sidewalls of the base mandrel structure and the fin mandrel structure, performing at least one etching process to remove portions of the inverted, generally T-shaped mandrel feature not covered by a sidewall spacer, wherein, after the etching process is completed, the sidewall spacers and remaining portions of the mandrel feature, collectively, define a fin pattern for a plurality of fins to be formed in the substrate, and performing at least one additional process operation to form a plurality of fins in the substrate that correspond to the fin pattern.

Another illustrative method includes, among other things, forming an inverted, generally T-shaped mandrel feature above a semiconductor substrate, the mandrel feature having a base mandrel structure and a substantially vertically oriented fin mandrel structure located above the base mandrel structure, the base mandrel structure having a lateral width that is greater than a lateral width of the fin mandrel structure, forming upper sidewall spacers adjacent substantially vertically oriented sidewalls of the fin mandrel structure and lower sidewall spacers adjacent substantially vertically oriented sidewalls of the base mandrel structure, selectively removing at least a portion of at least one of the upper sidewall spacers, while leaving the lower sidewall spacers in position, after selectively removing at least a portion of at least one of the upper sidewall spacers, performing at least one etching process to remove portions of the inverted, generally T-shaped mandrel feature not covered by a sidewall spacer, wherein, after the etching process is completed, the sidewall spacers and remaining portions of the mandrel feature, collectively, define a fin pattern for a plurality of fins to be formed in the substrate, and performing at least one additional process operation to form a plurality of fins in the substrate that correspond to the fin pattern.

BRIEF DESCRIPTION OF THE DRAWINGS

The disclosure may be understood by reference to the following description taken in conjunction with the accompanying drawings, in which like reference numerals identify like elements, and in which:

FIG. 1A is a perspective view of one illustrative embodiment of a prior art FinFET device;

FIGS. 1B-1F depict illustrative prior art methods of removing selected fin structures when forming FinFET semiconductor devices.

Figure 2A:
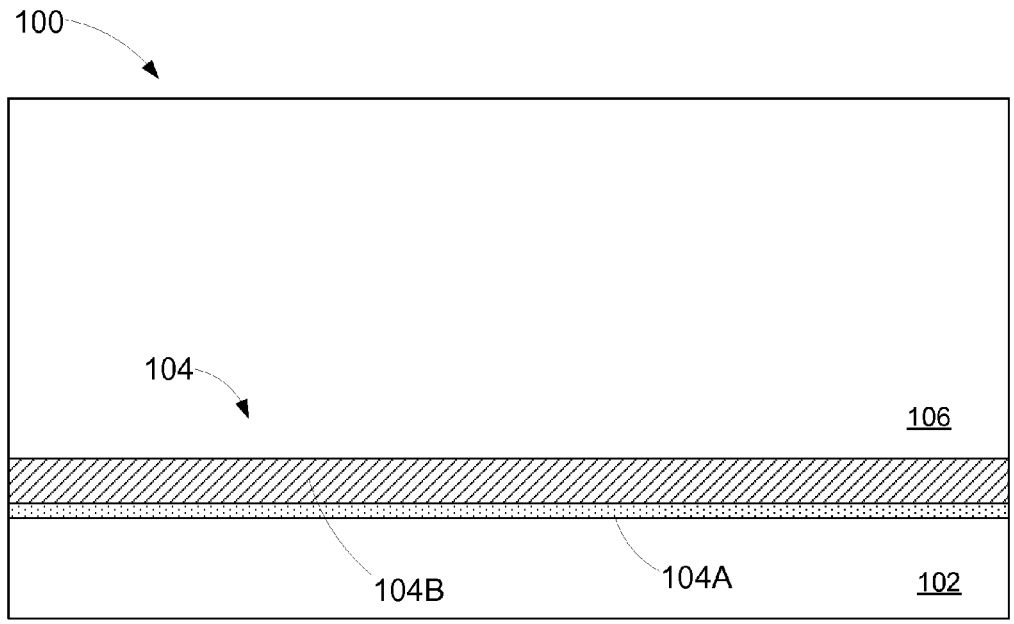
FIGS. 2A-2AA depict various illustrative methods disclosed herein for forming fins for FinFET semiconductor devices and the selective removal of some of the fins.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming fins for FinFET semiconductor devices and the selective removal of some of the fins. As will be readily apparent to those skilled in the art upon a complete reading of the present application, the methods disclosed herein may be employed in manufacturing a variety of different devices, including, but not limited to, logic devices, memory devices, etc. With reference to the attached figures, various illustrative embodiments of the methods and devices disclosed herein will now be described in more detail.

FIGS. 2A-2AA depict one illustrative embodiment of a method of forming fins for an integrated circuit product 100 that will include a plurality of FinFET semiconductor devices and the selective removal of some of the fins. The integrated circuit product 100 is formed on a semiconducting substrate 102, a bulk substrate or an active layer of an SOI type substrate. The substrate 102 may be made of silicon or it may be made of materials other than silicon. Thus, the terms "substrate" or "semiconducting substrate" should be understood to cover all forms of all semiconductor materials. As will be recognized by those skilled in the art after a complete reading of the present application, the illustrative integrated circuit product 100 may be comprised of a plurality of N-type FinFET devices and/or a plurality of P-type FinFET devices.

As will be appreciated by those skilled in the art after a complete reading of the present application, various doped regions, e.g., source/drain regions, halo implant regions, well regions and the like for the devices, are not depicted in the attached drawings. Of course, the inventions disclosed herein should not be considered to be limited to the illustrative examples depicted and described herein. The various components and structures of the integrated circuit product 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

FIG. 2A depicts the product 100 after materials for what will become a patterned masking layer 104, e.g., a patterned hard mask layer, were formed above the substrate 102, and after a first layer of mandrel material 106 was formed above the layer 104. The relative thicknesses of the substrate 102 and the first layer of mandrel material 106 are not to scale. The patterned masking layer 104 is intended to be representative in nature as it may be comprised of one or more layers of a variety of different materials, such as, for example, silicon nitride, silicon oxynitride, silicon dioxide, etc. In one illustrative embodiment, the patterned masking layer 104 may be comprised of a layer of silicon dioxide 104A (pad-oxide) that is formed on the substrate 102 and a layer of silicon nitride 104B (pad-nitride) that is formed on the layer of silicon dioxide 104A. The first layer of mandrel material 106 may be comprised of a variety of different materials, such as, for example, amorphous silicon, polysilicon, etc., that may be selectively removed relative to various surrounding structures, as described more fully below. In one illustrative embodiment, the first layer of mandrel material 106 may be a layer of amorphous silicon having a thickness of about 50-100 nm.

Figure 2B:
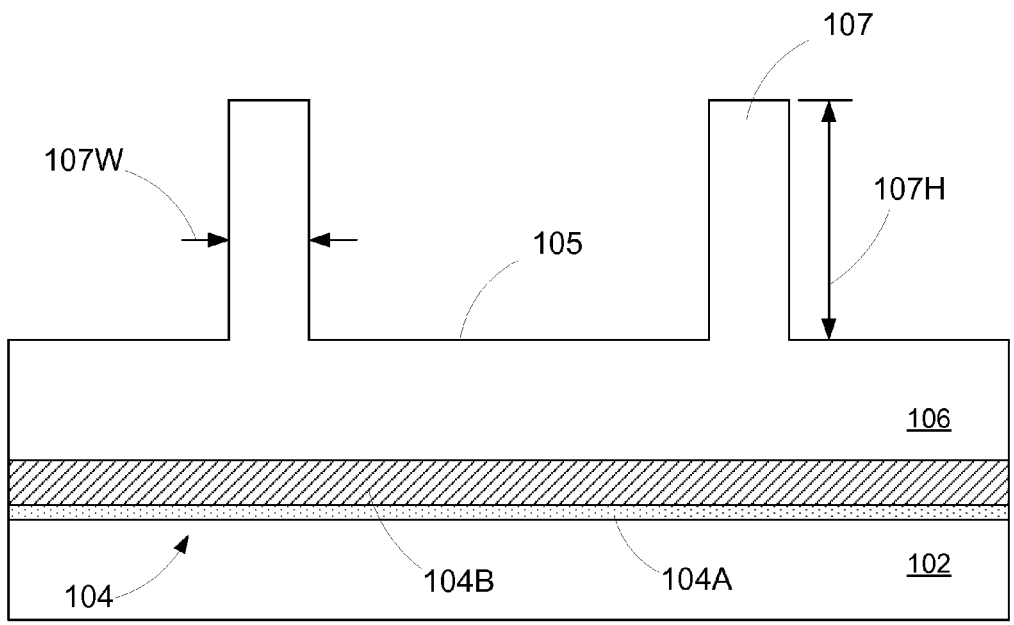

FIG. 2B depicts the product 100 after an anisotropic etching process was performed through a patterned masking layer (not shown), e.g., a patterned layer of photoresist material, to define a plurality trenches 105 in the first layer of mandrel material 106. The trenches 105 define a plurality of initial fin structures 107. The number of initial fin structures 107 formed, as well as the height 107H (i.e., the depth of the trenches 105) and the width 107W of the initial fin structures 107, may vary depending upon the particular application and the desired pattern of the fins that will ultimately be formed in the substrate 102. In one illustrative example, the initial fin structures 107 may have a height 107H of about 35-70 nm and a width 107W of about 15-35 nm.

Figure 2C:
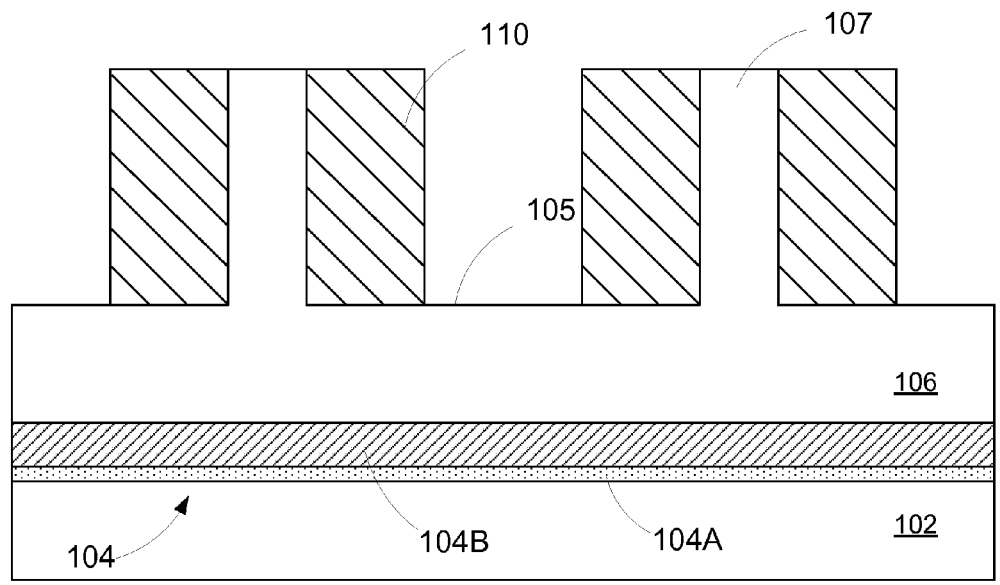

FIG. 2C depicts the product 100 after simplistically depicted sidewall spacers 110 were formed adjacent the initial fin structures 107. The sidewall spacers 110 were formed by depositing a layer of spacer material (e.g., silicon dioxide) and thereafter performing an anisotropic etching process. The spacers 110 may be of any desired thickness, and the thickness may vary depending upon the particular application, e.g., the fin width and fin pitch of the fins that will ultimately be formed in the substrate 102.

Figure 2D:
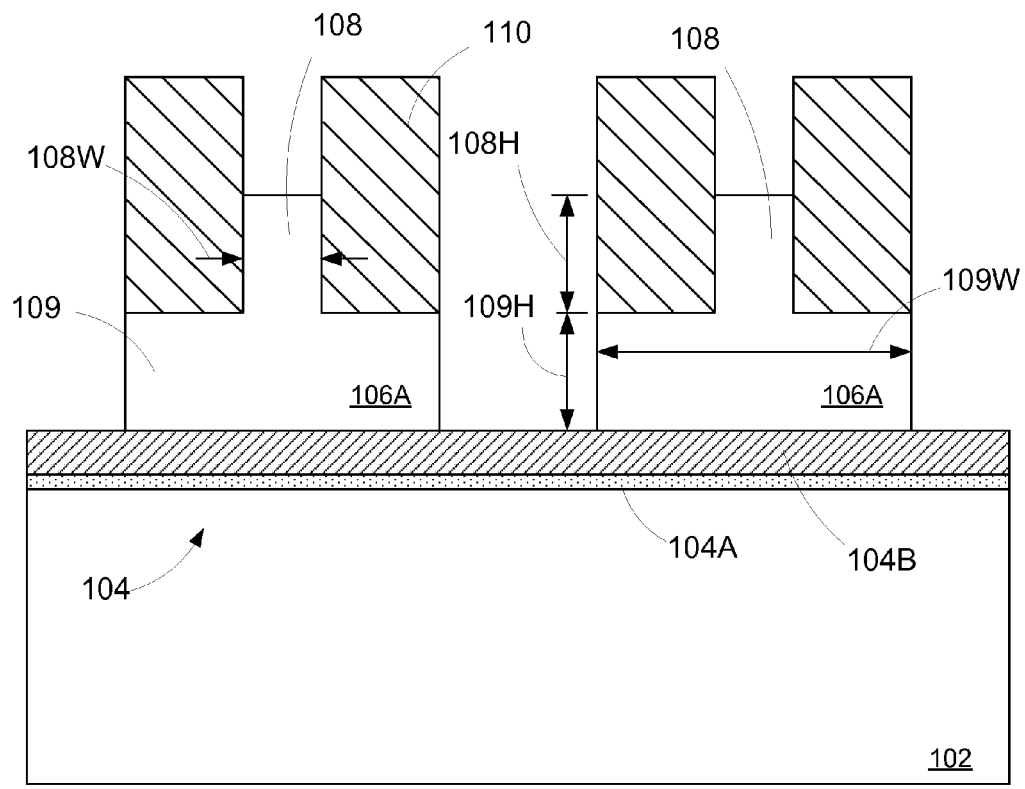

FIG. 2D depicts the product 100 after a timed, anisotropic etching process was performed to define a plurality of inverted, T-shaped mandrel features 106A. This etching process stops on the layer 104. More specifically, the etching process was performed so as to reduce the height 107H of the initial fin structures 107 and to etch the portions of the first mandrel material layer 106 positioned laterally outside of the spacers 110. As depicted, each of the inverted, T-shaped mandrel features 106A comprises a substantially vertically oriented fin mandrel structure 108 that is positioned above a mandrel base 109. The number of inverted, T-shaped mandrel features 106A formed, as well as the height 108H and the width 108W of the fin mandrel structures 108 and the height 109H and the width 109W of the mandrel base 109, may vary depending upon the particular application and the desired pattern of the fins that will ultimately be formed in the substrate 102. In one illustrative example, the fin mandrel structures 108 may have a height 108H of about 20-40 nm and a width 108W of about 15-35 nm, while the mandrel base 109 may have a height 109H of about 20-40 nm and a width 109W of about 65-120 nm. In general, the width 109W of the base 109 will be greater than the width 108H of the fin mandrel structures 108.

Figure 2E:
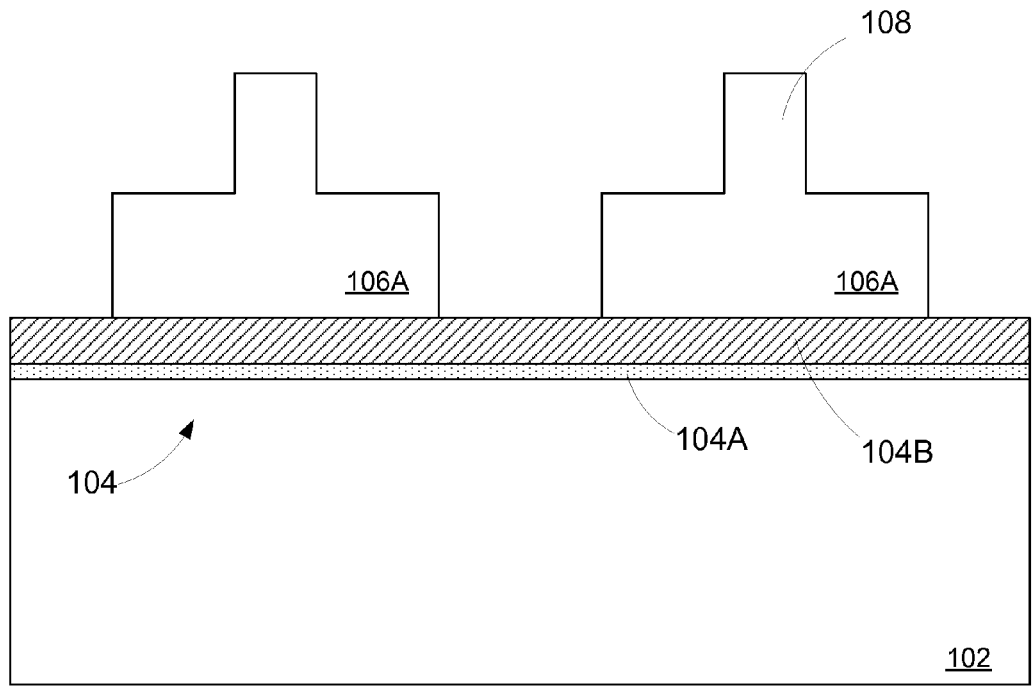

FIG. 2E depicts the product 100 after an etching process was performed to remove the spacers 110 from the inverted, T-shaped mandrel features 106A.

Figure 2F:
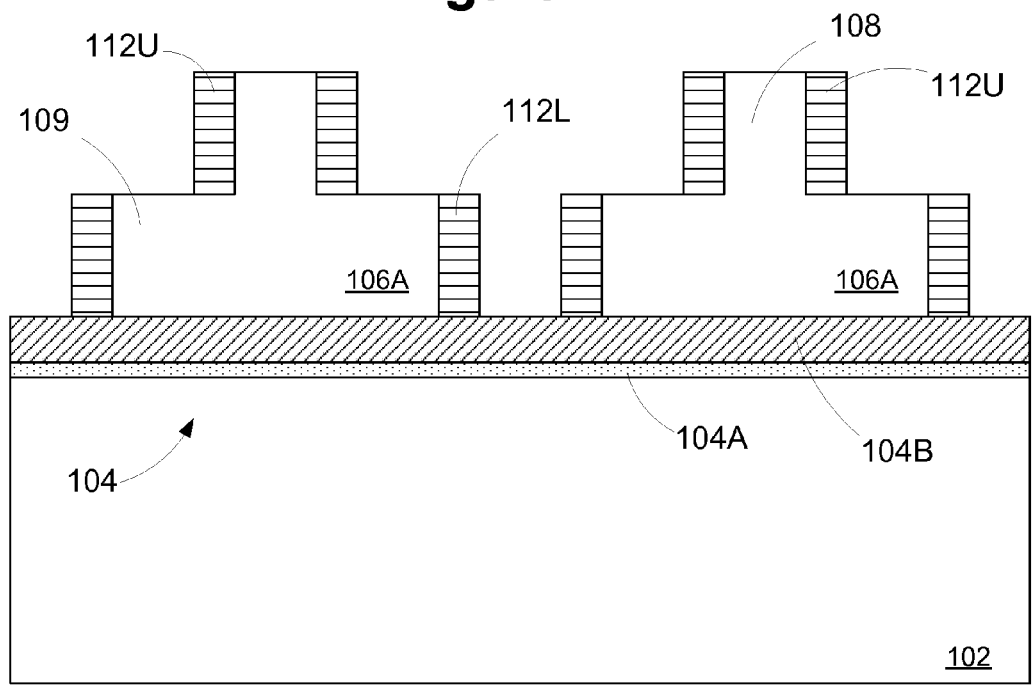

FIG. 2F depicts the product 100 after a plurality of simplistically depicted sidewall spacers 112 were formed adjacent the inverted, T-shaped mandrel features 106A. More specifically, a plurality of upper spacers 112U were formed adjacent the sidewalls of the vertically oriented fin mandrel structures 108 and a plurality of lower sidewall spacers 112L were formed adjacent the mandrel base structures 109 of the inverted, T-shaped mandrel features 106A. The sidewall spacers 112 were formed by depositing a layer of spacer material (e.g., silicon dioxide) and thereafter performing an anisotropic etching process. The spacers 112 may be of any desired thickness, and the thickness may vary depending upon the particular application, e.g., the fin width and fin pitch of the fins that will ultimately be formed in the substrate 102.

Figure 2G:
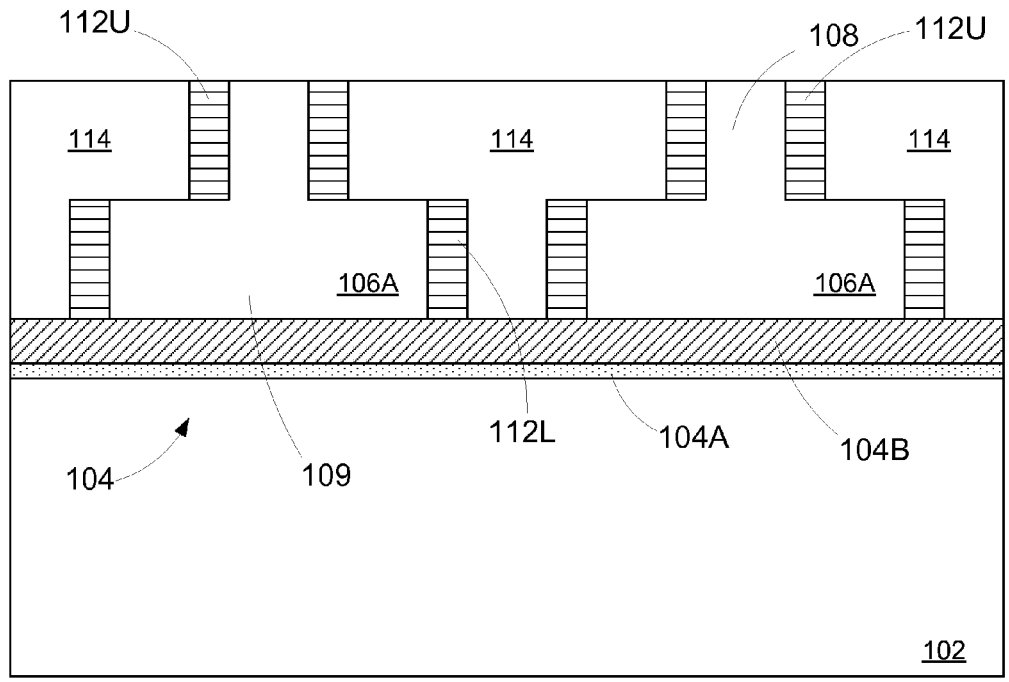

FIG. 2G depicts the product 100 after several process operations were performed. First, a sacrificial material layer 114 was formed above the product 100 depicted in FIG. 2F. Then, a chemical mechanical polishing (CMP) process was performed to planarize the upper surface of the sacrificial material layer 114 with the upper sidewall spacers 112U. This process operation exposed the surface of the upper sidewall spacers 112U and the upper surface of the fin mandrel structure 108. The sacrificial material layer 114 may be comprised of the same materials as those described above for the first layer of mandrel material 106. In some cases, the layers 106 and 114 may be made of the same materials, although such may not be the case in all applications.

Figure 2H:
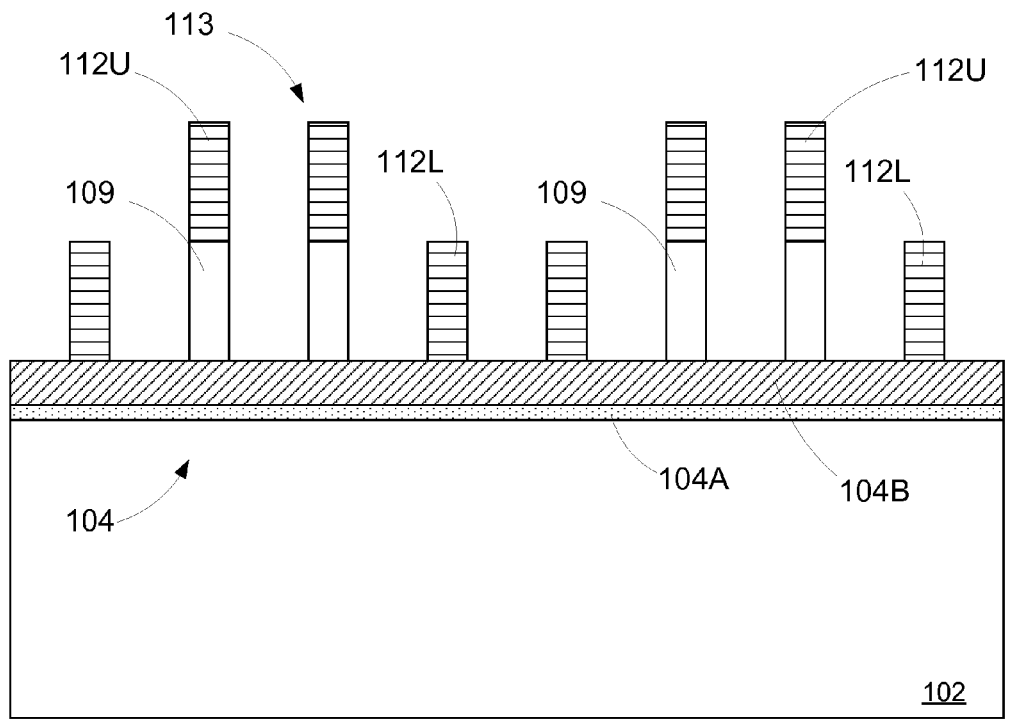

FIG. 2H depicts the product 100 after an anisotropic etching process was performed to selectively remove the material layers 106, 114 relative to the spacers 112 and the layer 104. As depicted, portions of the mandrel base 109 of the inverted, T-shaped mandrel features 106A remain positioned under the upper spacers 112U. In general, the combination of the spacers 112 (both upper level spacers 112U and lower level spacers 112L) define a fin etching pattern 113 that will ultimately be used in defining fins having the desired width and fin pitch in the substrate 102. In some cases, the fin pattern 113 may be transferred to the layer 104 (to define a patterned etch mask) and, thereafter, the spacers 112 and the remaining portions of the mandrel base 109 may be removed prior to performing an etching process through the patterned etch mask to define the fins in the substrate 112. In other cases, the spacers 112 and the remaining portions of the mandrel base 109 may remain in position throughout all of the etching processes that are ultimately performed to define the trenches in the substrate 102 that define the fins. The operations performed in FIG. 2G, i.e., the addition of the sacrificial material layer 114, are performed to facilitate the removal of certain portions of the upper sidewall spacers 112U—the upper level of spacers—to make room for isolation structures. If desired, the operations in FIG. 2G may be omitted and the processing sequence would go straight from FIG. 2F to FIG. 2H, i.e., the etching process discussed in this paragraph may be performed on the structure depicted in FIG. 2F to arrive at the fin pattern 113 shown in FIG. 2H.

Figure 2I:
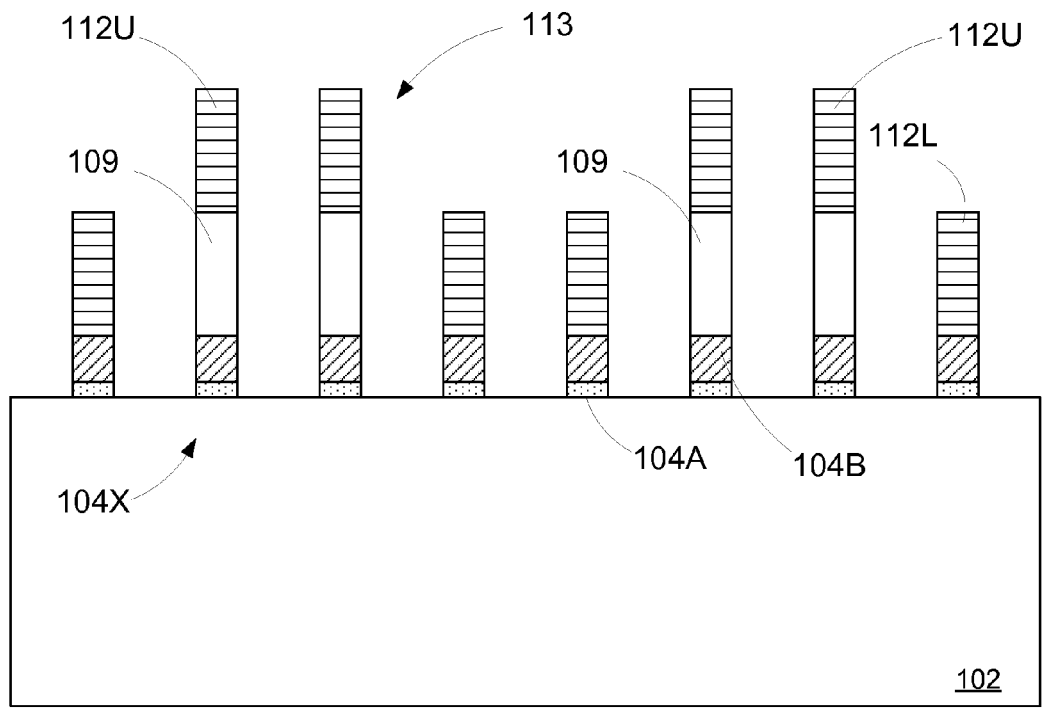

FIG. 2I depicts the product 100 after an anisotropic etching process was performed through the combination of the spacers 112 (both upper spacers 112U and lower spacers 112L) and the remaining portions of the mandrel base 109 to transfer the etching pattern 113 to the layer 104 and thereby define a patterned etch mask 104X. In some cases, the combination of the spacers 112 (both upper spacers 112U and lower spacers 112L) and the remaining portions of the mandrel base 109 may be removed after the patterned etch mask 104X is formed or, in other cases, they may remain in place when trenches are etched into the substrate to define a plurality of fins.

Figure 2J:
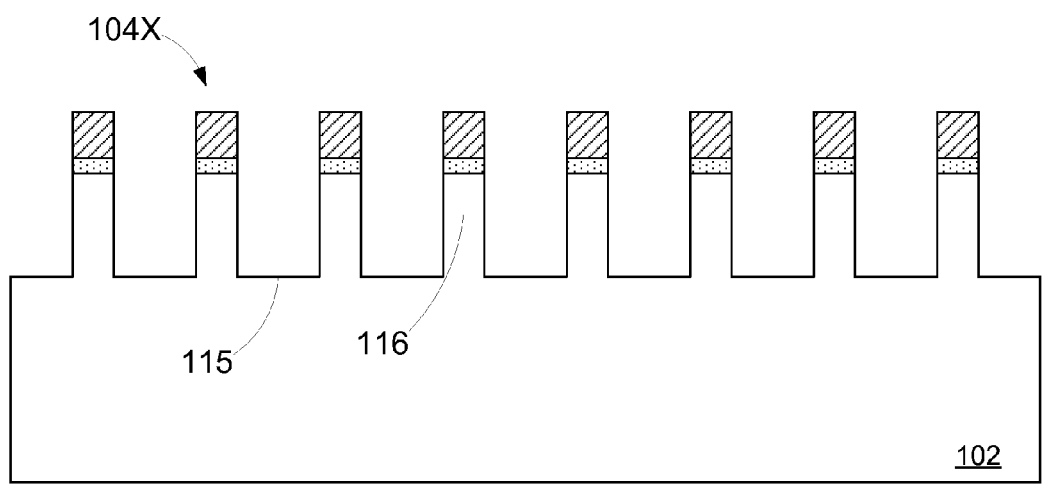

FIG. 2J depicts the product 100 after several process operations were performed. First, in one process flow, the combination of the spacers 112 (both upper 112U and lower 112L) and the remaining portions of the mandrel base 109 were selectively removed from the product 100 relative to the surrounding structures. Then, an anisotropic etching process was performed through the patterned etch mask 104X to define a plurality of fin-formation trenches 115 in the substrate 102 that define a plurality of fins 116 in the substrate 102 according to the fin pattern 113 (FIG. 2I). In other applications, the combination of the spacers 112 (both upper spacers 112U and lower spacers 112L) and the remaining portions of the mandrel base 109 may remain in place as an etching process is performed through these structures and the patterned etch mask 104X to form the trenches 115 that define the fins 116. In this latter case, the combination of the spacers 112 (both upper spacers 112U and lower spacers 112L) and the remaining portions of the mandrel base 109 may be consumed in the etching of the masking layer 104 and/or the etching of the trenches 115 into the substrate. If any of the materials 112/109 remain, they may be removed after performing the traditional process operation of forming a layer of silicon dioxide that over-fills the trenches 115 and thereafter performing a CMP process that stops on the upper surface of the fins 116.

At this point in the process flow, traditional manufacturing techniques may be performed to complete the fabrication of the FinFET devices for the product 100. For example, a recessed layer of insulating material (not shown) may be formed in the trenches 115 between the fins 116, portions of certain selected fins may be removed to make room for isolation structures (not shown), the patterned hard mask 104X may or may not be removed, gate structures (not shown) for the FinFET devices may be formed using either gate-first or gate-last manufacturing techniques, etc.

Using the novel inverted, T-shaped mandrel features 106A and the methods disclosed herein also provides significant advantages as it relates to the formation of isolation structures on products 100 containing FinFET devices. As discussed in the background section of this application, some portion or one or more of the fins 116 needs to be removed to make room for an isolation structure that is positioned between adjacent devices. The size of the isolation region as well as the portions of the fins to be removed may vary depending upon the particular application. In some cases, the formation of an isolation structure involves removing a portion of a single fin positioned between two adjacent fins, which can be particularly problematic for the reasons set forth in the background section of this application. As described more fully below, due to the formation of the inverted, T-shaped mandrel features 106A and the spacers 112, the removal of desired portions of the fins 116 is more easily accomplished in that larger process and misalignment margins are provided and the damage to fins adjacent what would otherwise be the removed fin are avoided.

Figure 2K:
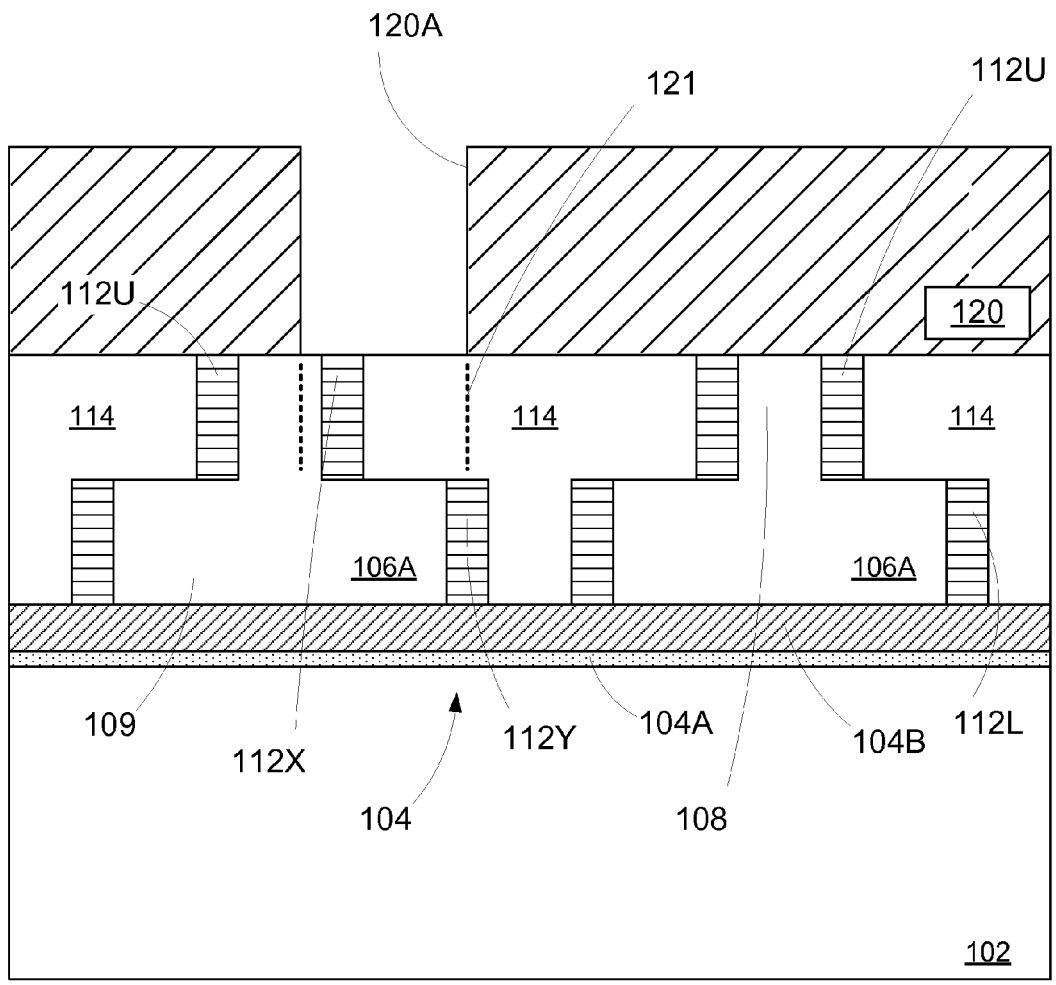
Figure 2L:
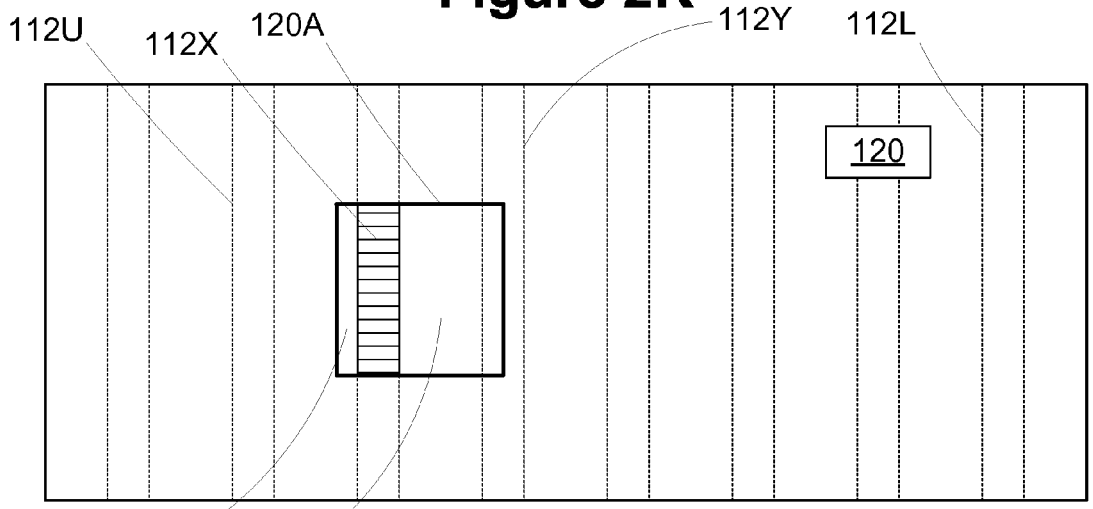

FIGS. 2K-2L depict the product 100 after a patterned masking layer 120, e.g., a patterned layer of photoresist, a so-called "cut mask" or "fin cut mask," was formed above the product depicted in FIG. 2G (after planarization of the sacrificial material layer 114). In this illustrative example, a portion of the axial length (into and out of the drawing page) of the upper spacer 112X that corresponds to a fin that would otherwise be formed in the substrate 102 will be removed. FIG. 2L is a simplistic plan view of the product 100 showing the opening 120A in the patterned masking layer or cut mask 120 that exposes a portion of the spacer 112X. Note that the opening 120A is significantly misaligned in that the opening 120A (as reflected by the extended lines 121) would also remove a portion of a spacer 112Y were it not for the protection provided by the sacrificial material layer 114 positioned above the spacer 112Y.

Figure 2M:
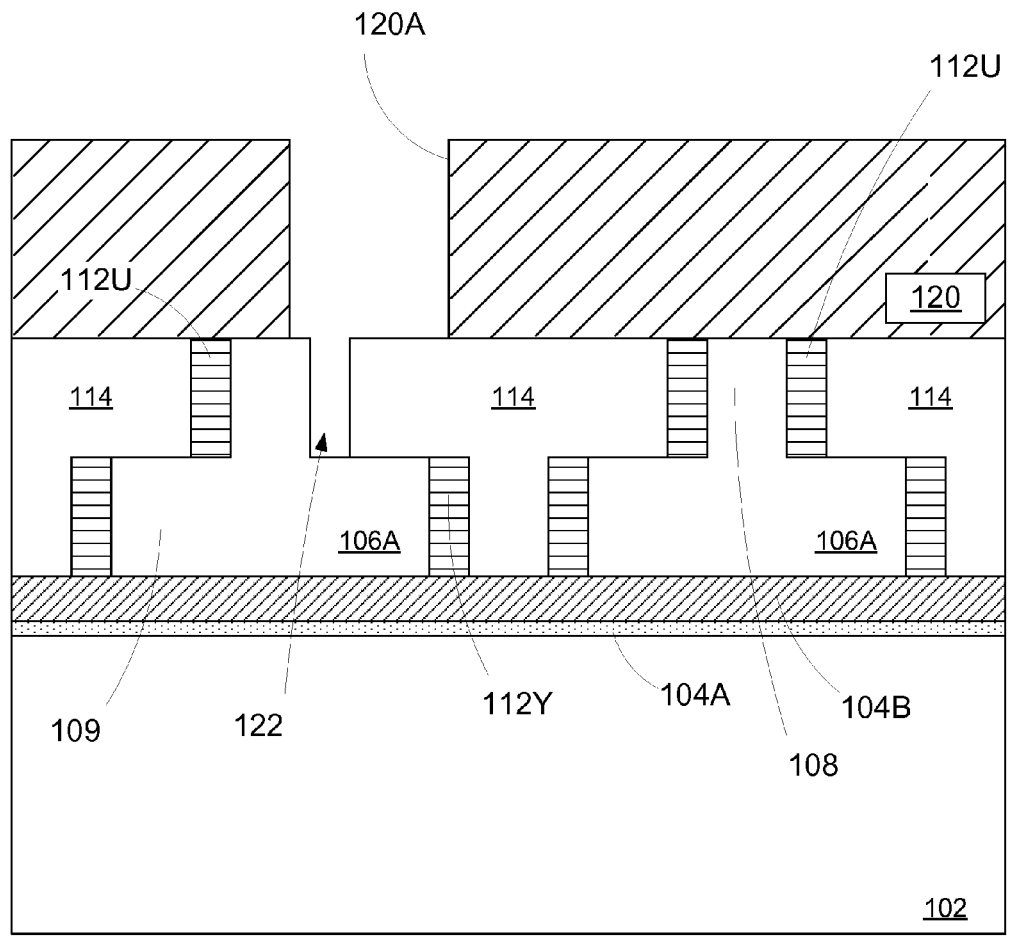
Figure 2N:
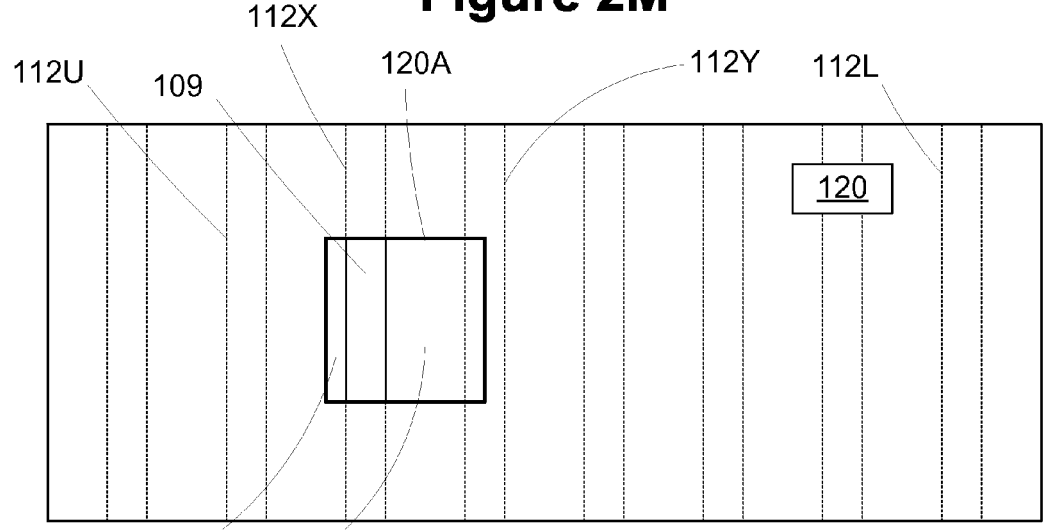

FIGS. 2M-2N depict the product 100 after an etching process (anisotropic or isotropic) was performed through the opening 120A in the patterned masking layer 120 to remove the exposed spacer 112X (see FIG. 2K) selectively to the mandrel feature 106A. This process operation results in the formation of space 122 that exposes the underlying mandrel base 109 of the inverted, T-shaped mandrel feature 106A.

Figure 2O:
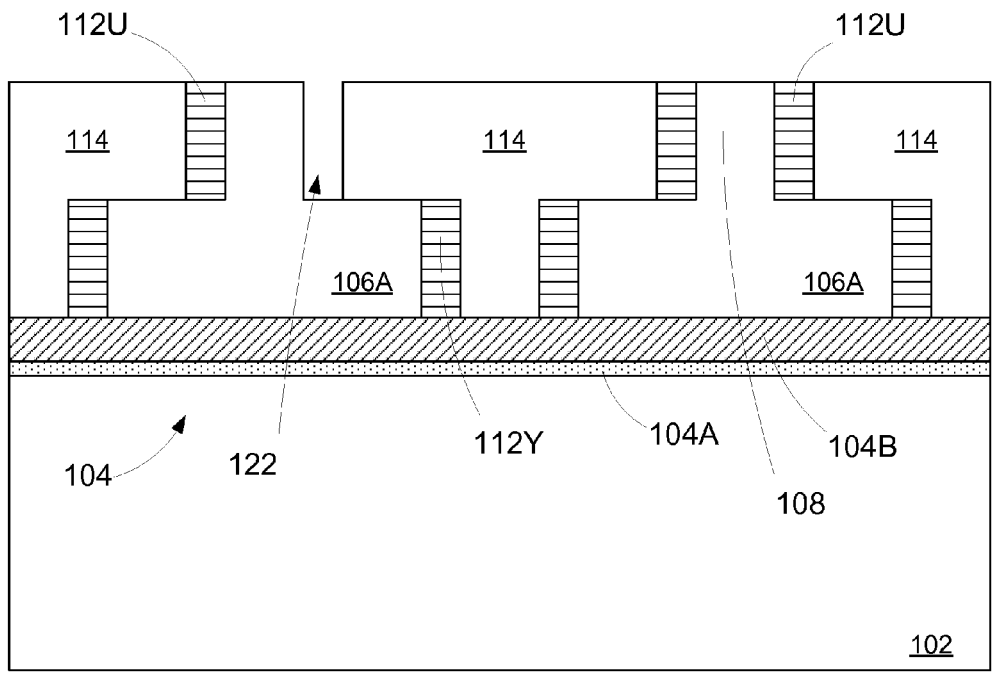

FIG. 2O depicts the product 100 after the patterned masking layer 120 was removed.

Figure 2P:
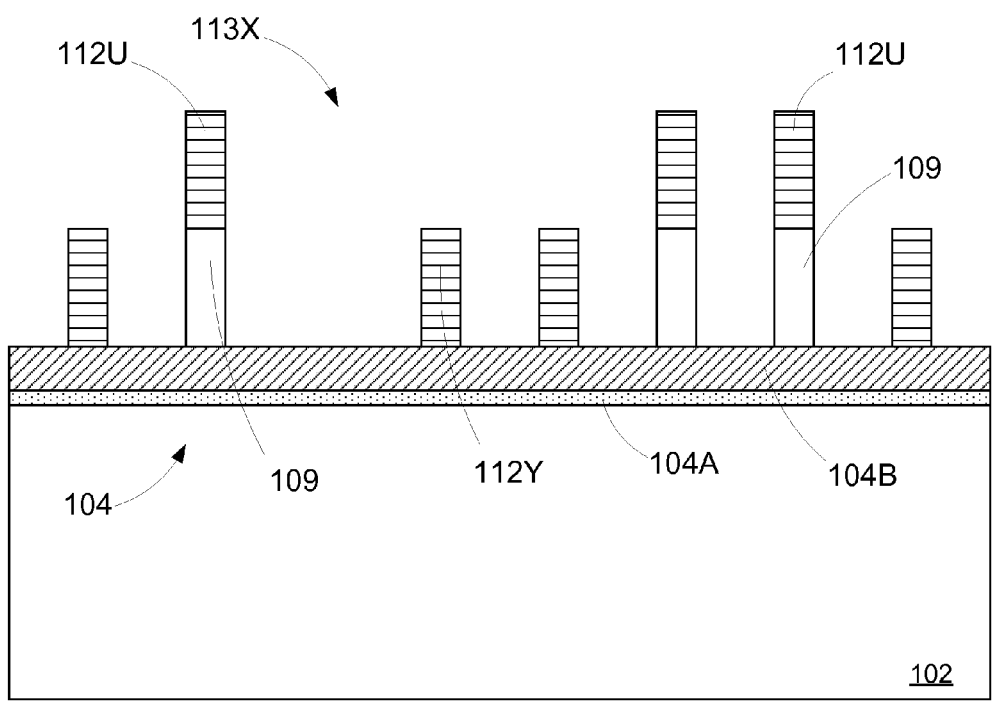

FIG. 2P depicts the product 100 after an anisotropic etching process was performed to selectively remove the first and second layers 106, 114 relative to the spacers 112 (other than the removed portion of the spacer 112X) and the layer 104. As depicted, portions of the mandrel base 109 of the inverted, T-shaped mandrel features 106A remain positioned under the remaining upper spacers 112U. In general, the combination of the spacers 112 (both upper 112U and lower 112L) define a fin etching pattern 113X that will ultimately be used in defining fins having the desired width and fin pitch in the substrate 102 and with space provided for an isolation material in the area that would have been occupied by a fin corresponding to the removed portion of the sidewall spacer 112X.

Figure 2Q:
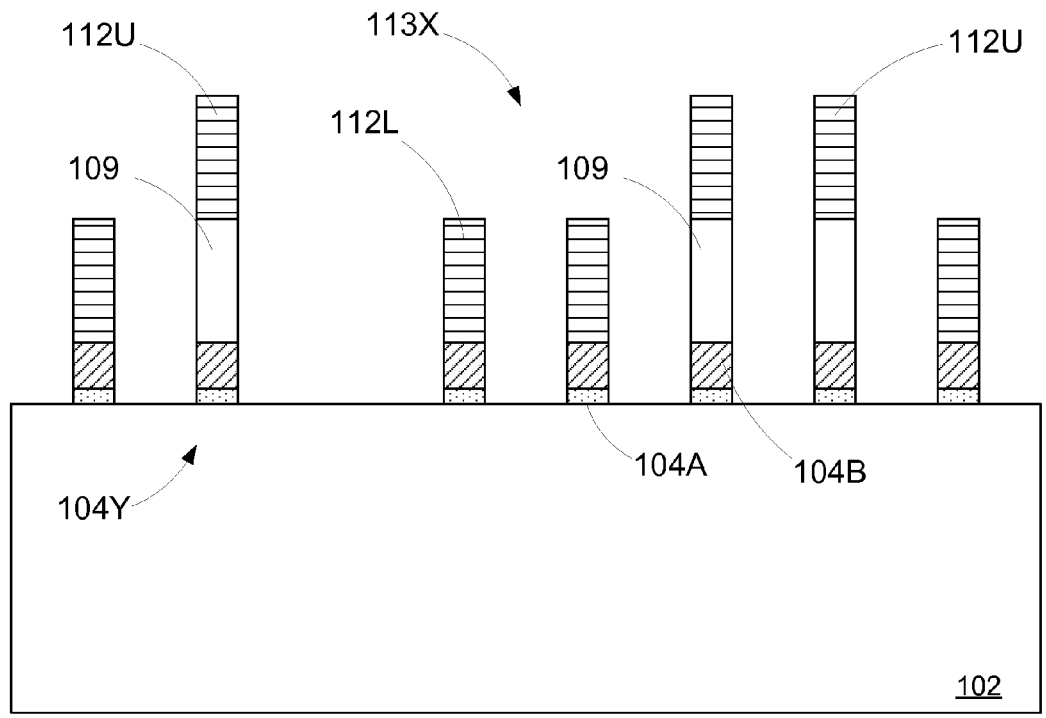

FIG. 2Q depicts the product 100 after an anisotropic etching process was performed through the combination of the spacers 112 (both the remaining upper spacers 112U and lower spacers 112L) and the remaining portions of the mandrel base 109 to transfer the etching pattern 113X to the layer 104 and thereby define a patterned etch mask 104Y.

Figure 2R:
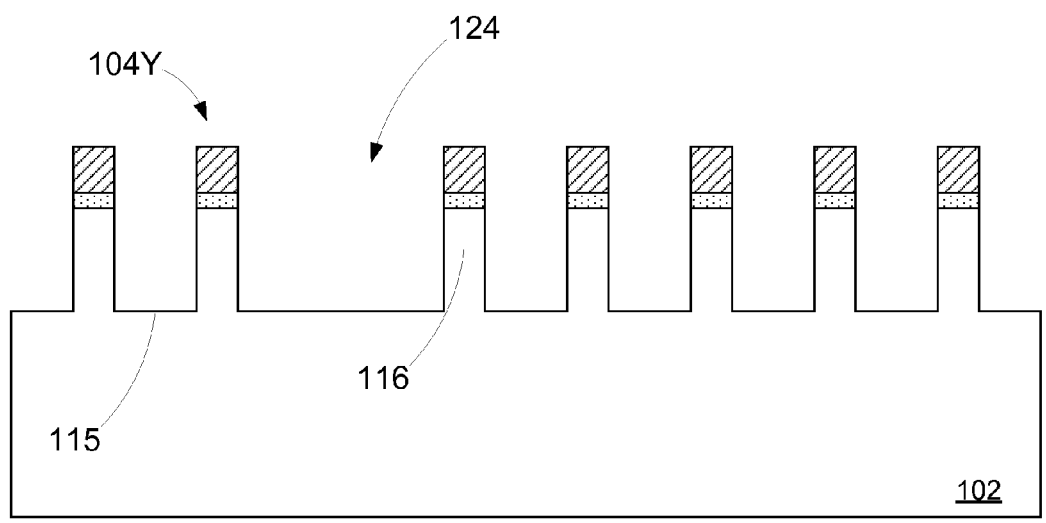

FIG. 2R depicts the product 100 after several process operations were performed. First, the combination of the spacers 112 (both the remaining upper spacers 112U and lower spacers 112L) and the remaining portions of the mandrel base 109 were selectively removed from the product 100 relative to the surrounding structures. Then, an anisotropic etching process was performed through the patterned etch mask 104Y to define a plurality of fin-formation trenches 115 in the substrate 102 that define a plurality of fins 116 in the substrate 102 according to the fin pattern 113X. Note that, due to the removal of the spacer 112X, a trench or opening 124 is now formed in the substrate 102 at a location that would have otherwise been occupied by a fin using the fins-cut-last strategy described in the background section of this application. An isolation material (not shown) may be formed in the trench 124. At this point in the process flow, traditional manufacturing techniques may be performed to complete the fabrication of the FinFET devices for the product 100.

Figure 2S:
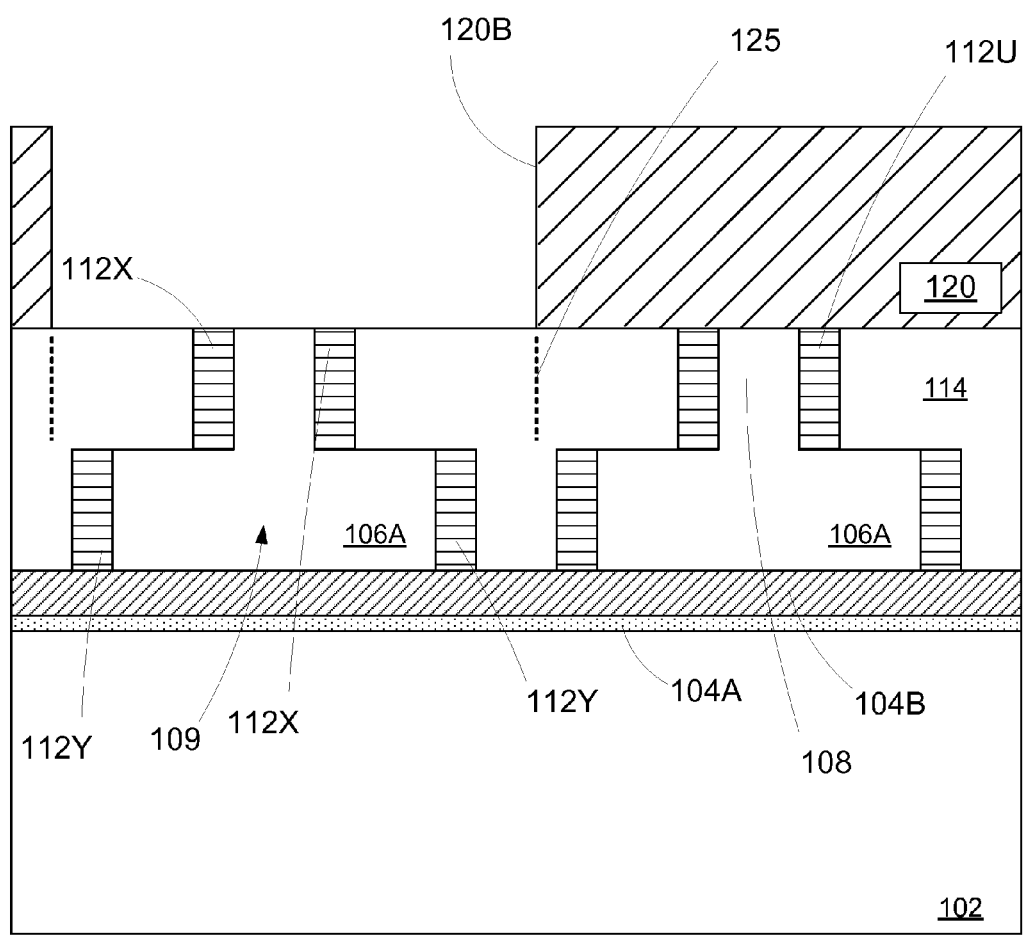
Figure 2T:
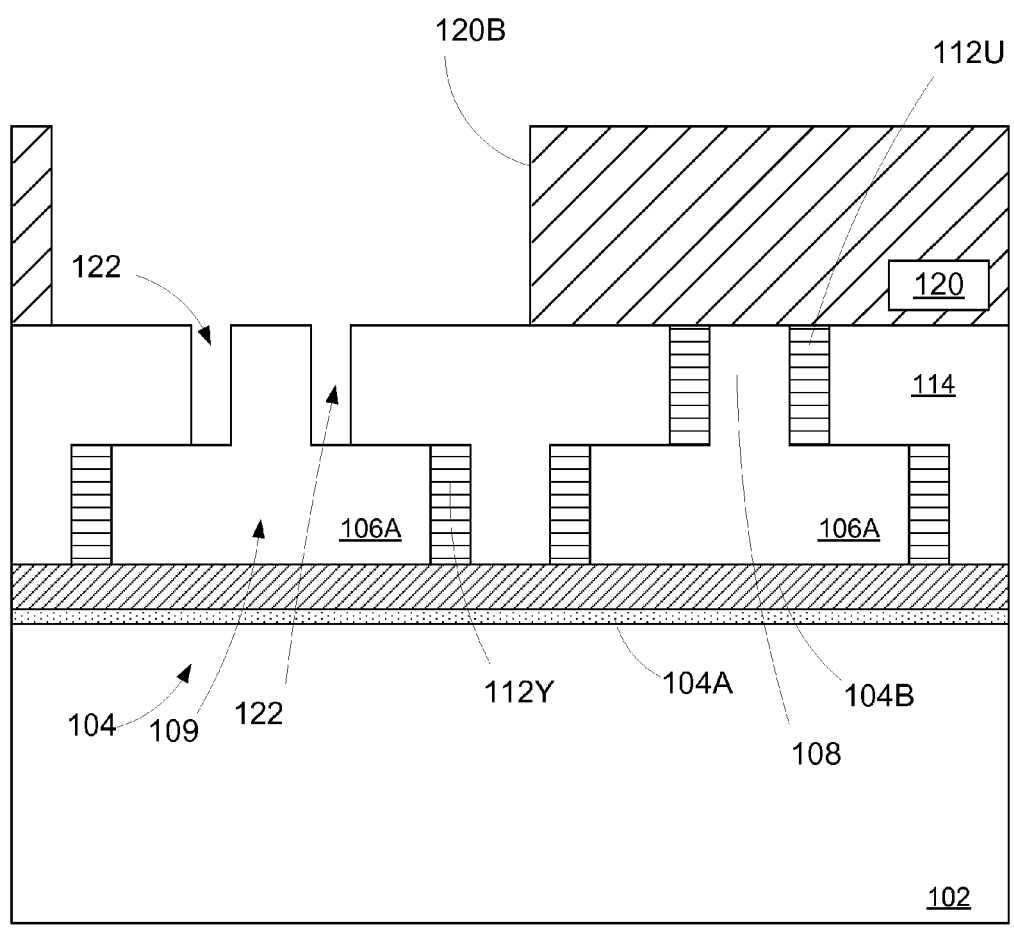

As will be appreciated by those skilled in the art after a complete reading of the present application, the novel methods and structures disclosed herein may be employed to remove portions (or all) of any desired number of fins. For example, FIGS. 2S-2T depict an illustrative example wherein two of the upper spacers 112U will be removed. As depicted, the opening 120B in the patterned masking layer 120 reflects a significant process window so as to expose the two fins 112X to be removed (note that two of the lower spacers 112Y would be exposed by the opening 120B and removed if they were not protected by the sacrificial material layer 114.

FIG. 2T depicts the product 100 after an etching process (anisotropic or isotropic) was performed through the opening 120B in the patterned masking layer or cut mask 120 to remove the two exposed spacers 112X (see FIG. 2S) selectively to the mandrel feature 106A. This process operation results in the formation of spaces 122 that expose the underlying mandrel base 109 of the inverted, T-shaped mandrel feature 106A.

Figure 2U:
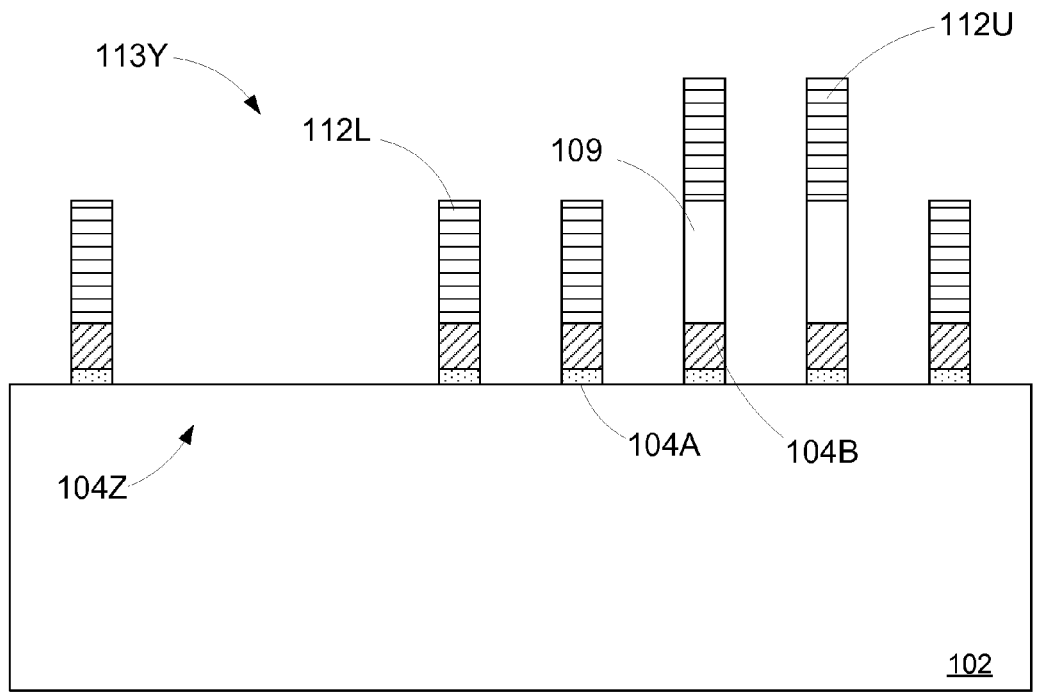

FIG. 2U depicts the product 100 after an anisotropic etching process was performed to selectively remove the layers 106, 114 relative to the spacers 112 (other than the removed portion of the two spacers 112X) and the layer 104. As depicted, portions of the mandrel base 109 of the inverted, T-shaped mandrel features 106A remain positioned under the remaining upper spacers 112U. In general, the combination of the spacers 112 (both upper spacers 112U and lower spacers 112L) define a fin etching pattern 113Y that will ultimately be used in defining fins having the desired width and fin pitch in the substrate 102 and with space provided for an isolation material in the area that would have been occupied by a fin corresponding to the removed portions of the two sidewall spacers 112X. FIG. 2U also depicts the product 100 after an anisotropic etching process was performed through the combination of the spacers 112 (both the remaining upper spacers 112U and lower spacers 112L) and the remaining portions of the mandrel base 109 to transfer the etching pattern 113Y to the layer 104 and thereby define a patterned etch mask 104Z.

Figure 2V:
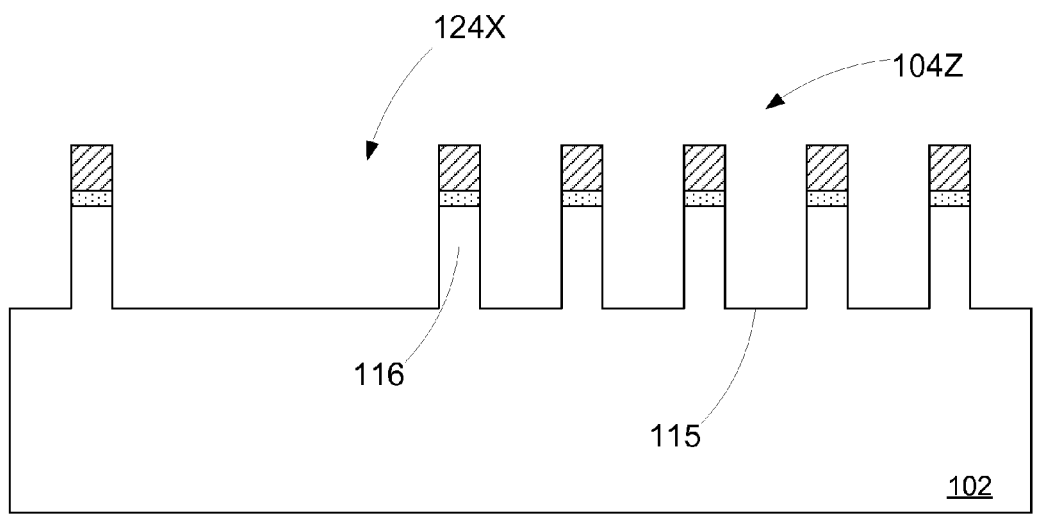

FIG. 2V depicts the product 100 after several process operations were performed. First, the combination of the spacers 112 (both the remaining upper spacers 112U and lower spacers 112L) and the remaining portions of the mandrel base 109 were selectively removed from the product 100 relative to the surrounding structures. Then, an anisotropic etching process was performed through the patterned etch mask 104Z to define a plurality of fin-formation trenches 115 in the substrate 102 that define a plurality of fins 116 in the substrate 102 according to the fin pattern 113Y. Note that, due to the removal of the two spacers 112X, a trench or opening 124X is now formed in the substrate 102 at a location that would have otherwise been occupied by fins using the fins-cut-last strategy described in the background section of this application. An isolation material (not shown) may be formed in the trench 124X. At this point in the process flow, traditional manufacturing techniques may be performed to complete the fabrication of the FinFET devices for the product 100.

FIGS. 2W-2Z depict one illustrative process flow depicting how portions (or all) of features 125X in a patterned hard mask 125 corresponding to multiple fins to be formed in a substrate may be removed using the methods disclosed herein using two so-called "cut masks" while avoiding the problems associated with the problems discussed in the background section of this application. The patterned hard mask layer 125 is comprised of a plurality of features 125X that correspond to what would otherwise be 12 fins that are to be formed in a substrate. In the example depicted herein, features 125X in the patterned hard mask layer 125 corresponding to nine of the 12 fins are to be removed using the methods disclosed herein. The mask features 125X have been numbered 1-12 in these drawings to facilitate the following description.

Figure 2W:
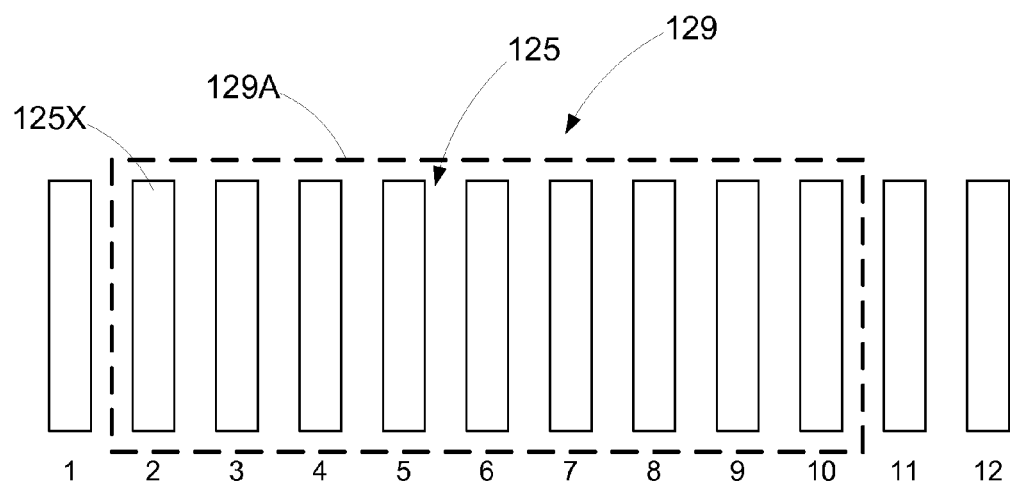

As shown in FIG. 2W, it is ultimately desired to remove portions of mask features 125X corresponding to fins 2-10. In prior art techniques, a cut-mask 129 having an opening 129A sized to remove all of the mask features 125X in the patterned hard mask layer 125 that correspond to all of fins 2-10, would have been formed above the patterned hard mask layer 125. Thereafter, the portions of the mask features 125X (corresponding to fins 2-10) that are exposed by the opening 129A would have been removed by performing a single etching process. This prior art technique had a very small process window or overlay margin. That is, misalignment of the opening 129A could result in damage to the mask features 125X that correspond to wanted fins 1 or 11, or such misalignment could result in formation of unwanted portions of the fin 2 or fin 10, if there was only partial removal of the mask features 125X in the patterned masking layer 125 that corresponded to fin 2 or fin 10. As shown more fully below, using one illustrative method disclosed herein, a first cut mask is used to remove the mask features 125X in the patterned hard mask layer 125 that correspond to fins in the boundary area between wanted and unwanted fins (as described in FIG. 2X), while a second cut mask (as described with reference to FIG. 2Y) is used to remove the mask features 125X in the patterned hard mask 125 that are not removed using the first cut mask.

Figure 2X:
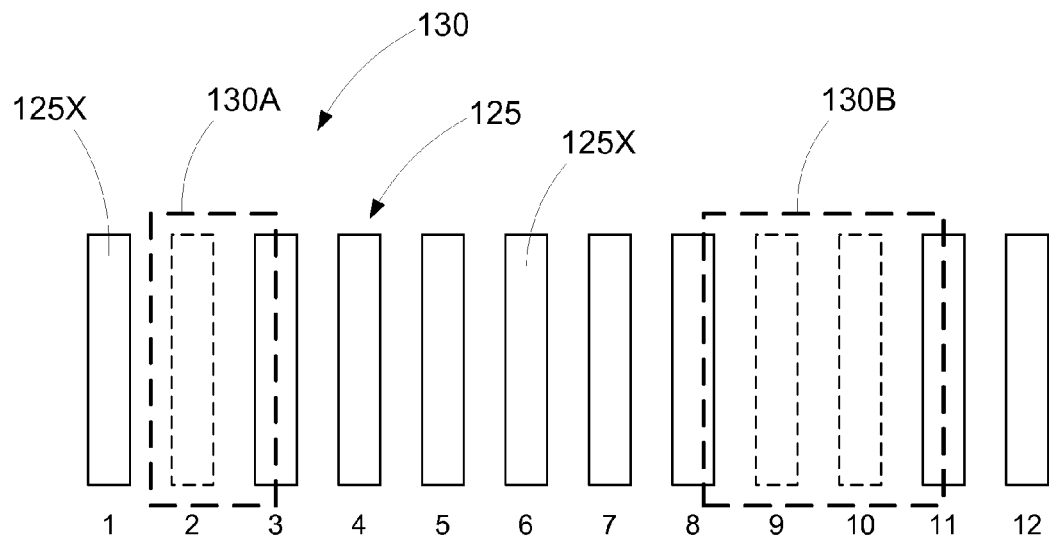

As shown in FIG. 2X, using the methods disclosed herein, a first cut mask 130 (i.e., a patterned etch mask layer like layer 120 described above) was formed above the mask features 125X. The cut mask 130 has openings 130A and 130B. The opening 130A is sized for the removal of a portion of the upper sidewall spacer 112U corresponding to a single mask feature 125X associated with fin number 2. The opening 130B is sized for the removal of portions of two upper sidewall spacers 112U corresponding to two mask features 125X that are associated with fin numbers 9-10. Basically, using the first cut mask 130, the mask features 125X near the edge of the final opening (after all nine mask features 125X are removed) is removed first. This increases the process window for a second cut mask that will be formed to remove the remaining sidewall spacers 112U corresponding to mask features 125X that correspond to fins 3-8. In short, the first cut mask resolves critical dimensions and makes misalignment of the second cut mask less problematic.

Figure 2Y:
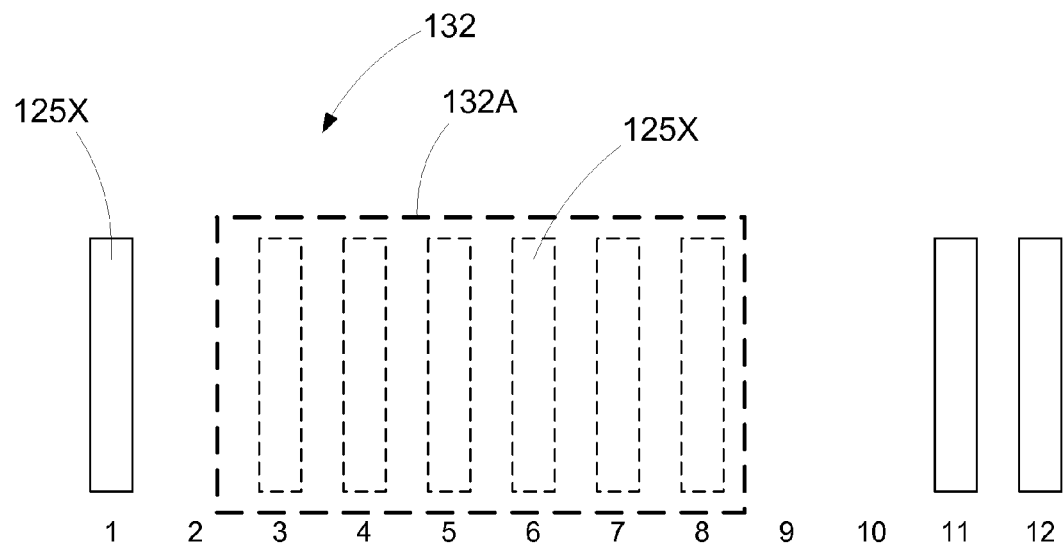

As shown in FIG. 2Y, using the methods disclosed herein, a second cut mask 132 (i.e., a patterned etch mask layer like layer 120 described above) was formed above the remaining mask features 125X. The cut mask 132 has an opening 132A. The opening 132A is sized for the removal of portions of six upper sidewall spacers 112U corresponding to mask features 125X that correspond to six fins, fin numbers 3-8. As noted above, by using the first cut mask 130, this process window for the formation of the second cut mask 132 is greater and misalignment of the opening 132A in the second cut mask 132 is less problematic.

Figure 2Z:
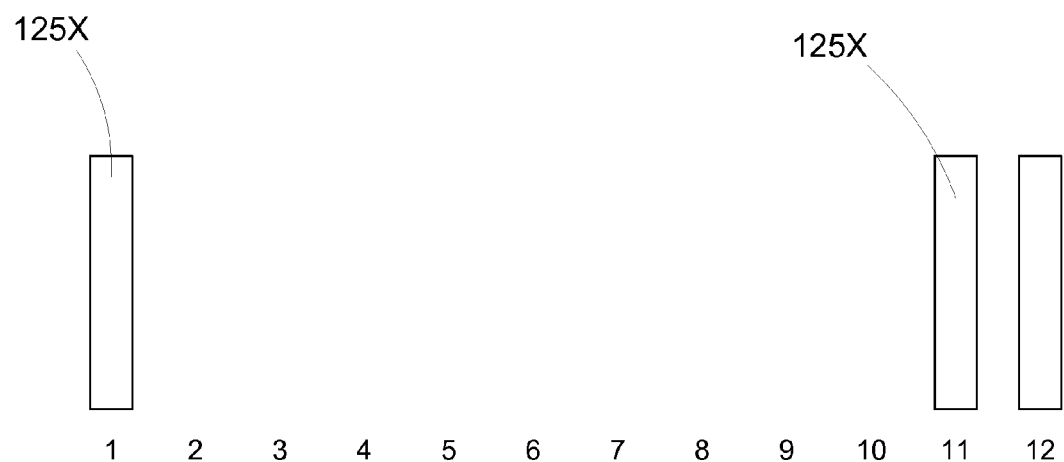
Figure 2A:
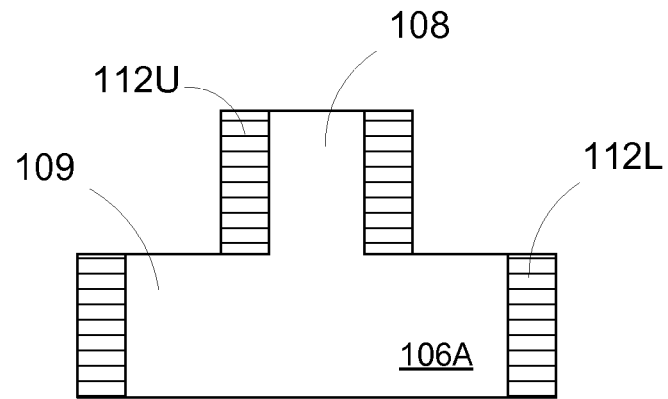
Figure 2A:
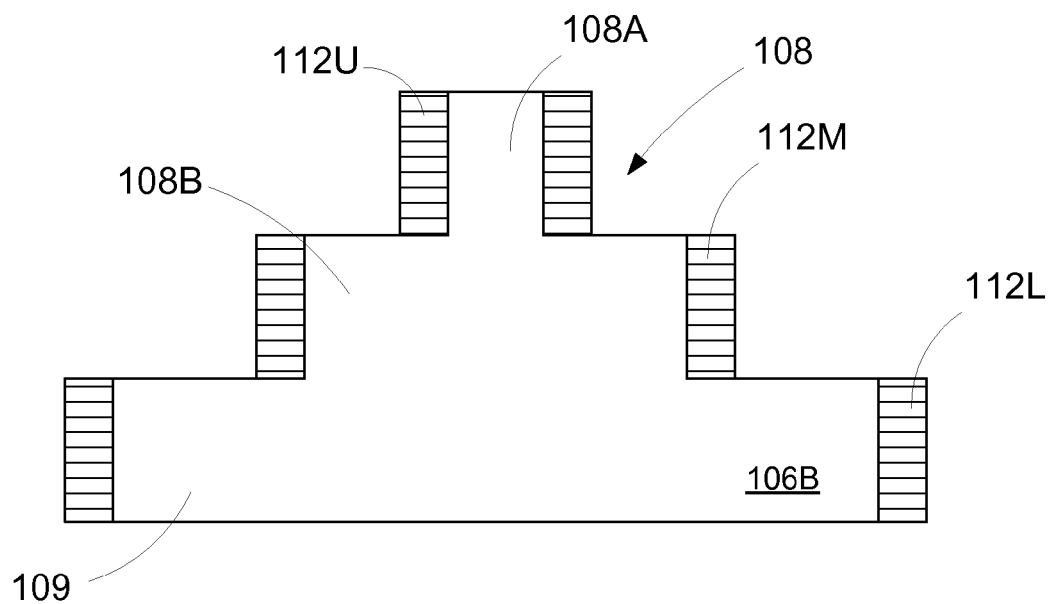

FIG. 2Z depicts the product after the desired portions of the mask features 125X corresponding to fins 2-10 were removed.

As will be appreciated by those skilled in the art after a complete reading of the present application, the techniques disclosed herein may be extended to form generally inverted, T-shaped mandrel features with more than the two levels of spacers 112 shown adjacent the substantially vertically oriented sidewalls of the previously described inverted, T-shaped mandrel feature 106A. FIG. 2AA depicts the T-shaped mandrel feature 106A and another T-shaped mandrel feature 106B, wherein the feature 106B has a vertically oriented fin mandrel structure 108 with a stepped configuration. As depicted, a plurality of lower sidewall spacers 112L were formed adjacent the mandrel base structures 109 of the inverted, T-shaped mandrel features 106B, upper spacers 112U were formed adjacent the sidewalls of the upper portion 108A of the stepped fin mandrel structure 108 and middle spacers 112M were formed adjacent the sidewalls of the lower portion of the stepped fin mandrel structure 108B. Fundamentally, the methods disclosed herein involve forming sidewall spacers adjacent to the vertically oriented sidewall surfaces of the generally T-shaped mandrel feature, (e.g., either 106A or 106B, etc.) that correspond to the desired fin pattern to be formed in the substrate 102. The generally T-shaped mandrel feature is then etched using the spacers as an etch mask. Thereafter, the fin pattern is used to define fins in the substrate corresponding to the fin pattern. Of course, as mentioned above, some portion of the upper spacers 112U may be removed to make room for an isolation structure prior to using the fin pattern to define the fins in the substrate 102.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   forming an inverted, generally T-shaped mandrel feature above a semiconductor substrate, said mandrel feature having a base mandrel structure and a substantially vertically oriented fin mandrel structure located above said base mandrel structure, said base mandrel structure having a lateral width that is greater than a lateral width of said fin mandrel structure wherein said forming said inverted, generally T-shaped mandrel feature above said semiconductor substrate comprises,
   forming a first layer of mandrel material above said substrate;
   etching a plurality of trenches into said first layer of mandrel material so as to define an initial fin structure having an initial height;
   forming a sacrificial spacers adjacent sidewalls of said initial fin structure;
   etching said first layer of mandrel material with said sacrificial spacers in position so as to reduce said initial height of said initial fin structure and thereby define said substantially vertically oriented fin mandrel structure and to pattern said first layer of mandrel material so as to define said base mandrel structure;
   forming a sidewall spacer adjacent substantially vertically oriented sidewalls of said base mandrel structure and said fin mandrel structure;

performing at least one etching process to remove portions of said inverted, generally T-shaped mandrel feature not covered by a sidewall spacer, wherein, after said etching process is completed, said sidewall spacers and remaining portions of said mandrel feature, collectively, define a fin pattern for a plurality of fins to be formed in said substrate; and performing at least one additional process operation to form a plurality of fins in said substrate that correspond to said fin pattern.

2. The method of claim 1, wherein said mandrel feature is comprised of one of amorphous silicon or polysilicon and said sidewall spacers are comprised of silicon dioxide.

3. The method of claim 1, wherein said substantially vertically oriented fin mandrel structure has a uniform width throughout its height.

4. The method of claim 1, wherein said substantially vertically oriented fin mandrel structure has a stepped configuration, a first portion being wider than a second portion, said first portion being located adjacent said base mandrel structure.

5. The method of claim 1, wherein, prior to forming said inverted, generally T-shaped mandrel feature, the method comprises forming a hard mask material above said substrate, wherein the method comprises forming said inverted, generally T-shaped mandrel feature above said hard mask material.

6. The method of claim 1, wherein said performing said at least one additional process operation comprises:
performing an etching process to transfer said fin pattern to a hard mask layer positioned above said substrate so as to thereby define a patterned hard mask layer;
removing said sidewall spacers and said remaining portions of said mandrel feature that define said fin pattern; and
performing at least one etching process through said patterned hard mask layer to define a plurality of fins in said substrate that have a pattern corresponding to said fin pattern.

7. The method of claim 1, wherein said performing said at least one additional process operation comprises:
performing at least one etching process through said sidewall spacers and said remaining portions of said mandrel feature that collectively define said fin pattern so as to pattern a hard mask layer positioned above said substrate and to define a plurality of fins in said substrate that have a pattern corresponding to said fin pattern; and
after defining said fins, removing said sidewall spacers and said remaining portions of said mandrel feature that define said fin pattern.

8. A method, comprising:
forming a hard mask material above a semiconductor substrate;
forming a first layer of mandrel material above said hard mask material;
etching a plurality of trenches into said first layer of mandrel material so as to define an initial fin structure having an initial height;
forming sacrificial spacers adjacent sidewalls of said initial fin structure;
etching said first layer of mandrel material with said sacrificial spacers in position so as to reduce said initial height of said initial fin structure and to pattern said first layer of mandrel material so as to define an inverted, generally T-shaped mandrel feature, said mandrel feature having a base mandrel structure positioned above said hard mask material and a substantially vertically oriented fin mandrel structure located above said base mandrel structure, said base mandrel structure having a lateral width that is greater than a lateral width of said fin mandrel structure;
removing said sacrificial spacers;
forming a sidewall spacer adjacent substantially vertically oriented sidewalls of said base mandrel structure and said fin mandrel structure;
performing at least one etching process to remove portions of said inverted, generally T-shaped mandrel feature not covered by a sidewall spacer, wherein, after said etching process is completed, said sidewall spacers and remaining portions of said mandrel feature, collectively, define a fin pattern for a plurality of fins to be formed in said substrate; and
performing at least one additional process operation to form a plurality of fins in said substrate that correspond to said fin pattern.

9. The method of claim 8, wherein said substantially vertically oriented fin mandrel structure has a uniform width throughout its height.

10. The method of claim 8, wherein said substantially vertically oriented fin mandrel structure has a stepped configuration, a first portion being wider than a second portion, said first portion being located adjacent said base mandrel structure.

11. The method of claim 8, wherein said performing at least one additional process operation comprises:
performing an etching process to transfer said fin pattern to said hard mask material so as to thereby define a patterned hard mask layer;
removing said sidewall spacers and said remaining portions of said mandrel feature that define said fin pattern; and
performing at least one etching process through said patterned hard mask layer to define a plurality of fins in said substrate that have a pattern corresponding to said fin pattern.

12. The method of claim 8, wherein said performing at least one additional process operation comprises:
performing at least one etching process through said sidewall spacers and said remaining portions of said mandrel feature that collectively define said fin pattern so as to pattern said hard mask material and to define a plurality of fins in said substrate that have a pattern corresponding to said fin pattern; and
after defining said fins, removing said sidewall spacers and said remaining portions of said mandrel feature that define said fin pattern.

13. A method, comprising:
forming an inverted, generally T-shaped mandrel feature above a semiconductor substrate, said mandrel feature having a base mandrel structure and a substantially vertically oriented fin mandrel structure located above said base mandrel structure, said base mandrel structure having a lateral width that is greater than a lateral width of said fin mandrel structure;
forming upper sidewall spacers adjacent substantially vertically oriented sidewalls of said fin mandrel structure and lower sidewall spacers adjacent substantially vertically oriented sidewalls of said base mandrel structure;
selectively removing at least a portion of at least one of said upper sidewall spacers, while leaving said lower sidewall spacers in position;
after selectively removing said at least a portion of at least one of said upper sidewall spacers, performing at least one etching process to remove portions of said inverted, generally T-shaped mandrel feature not covered by a sidewall spacer, wherein, after said etching process is completed, said sidewall spacers and remaining portions of said mandrel feature, collectively, define a fin pattern for a plurality of fins to be formed in said substrate; and performing at least one additional process operation to form a plurality of fins in said substrate that correspond to said fin pattern.

14. The method of claim 13, wherein said selectively removing at least a portion of at least one of said upper sidewall spacers, while leaving said lower sidewall spacers in position comprises:

forming a patterned etch mask above said inverted, generally T-shaped mandrel feature, said patterned etch mask having an opening that exposes said at least a portion of at least one of said upper sidewall spacers; and performing an etching process through said opening in said patterned etch mask so as to remove said exposed portion of said at least a portion of at least one of said upper sidewall spacers.

15. The method of claim 13, wherein said substantially vertically oriented fin mandrel structure has a uniform width throughout its height.

16. The method of claim 13, wherein said substantially vertically oriented fin mandrel structure has a stepped configuration, a first portion being wider than a second portion, said first portion being located adjacent said base mandrel structure.

17. The method of claim 13, wherein, prior to forming said inverted, generally T-shaped mandrel feature, the method comprises forming a hard mask material above said substrate, wherein the method comprises forming said inverted, generally T-shaped mandrel feature above said hard mask material.

18. The method of claim 13, wherein said performing at least one additional process operation comprises:

performing an etching process to transfer said fin pattern to a hard mask layer positioned above said substrate so as to thereby define a patterned hard mask layer;

removing said sidewall spacers and said remaining portions of said mandrel feature that define said fin pattern; and performing at least one etching process through said patterned hard mask layer to define a plurality of fins in said substrate that have a pattern corresponding to said fin pattern.

19. The method of claim 13, wherein said performing at least one additional process operation comprises:

performing at least one etching process through said sidewall spacers and said remaining portions of said mandrel feature that collectively define said fin pattern so as to pattern a hard mask layer positioned above said substrate and to define a plurality of fins in said substrate that have a pattern corresponding to said fin pattern; and after defining said fins, removing said sidewall spacers and said remaining portions of said mandrel feature that define said fin pattern.

20. The method of claim 12, wherein said forming said inverted, generally T-shaped mandrel feature above a semiconductor substrate comprises:

forming a first layer of mandrel material above said substrate;

etching a plurality of trenches into said first layer of mandrel material so as to define an initial fin structure having an initial height;

forming sacrificial spacers adjacent sidewalls of said initial fin structure; and etching said first layer of mandrel material with said sacrificial spacers in position so as to reduce said initial height of said initial fin structure and thereby define said substantially vertically oriented fin mandrel structure and to pattern said first layer of mandrel material so as to define said base mandrel structure.

21. A method, comprising:

forming an inverted, generally T-shaped mandrel feature above a semiconductor substrate, said mandrel feature having a base mandrel structure and a substantially vertically oriented fin mandrel structure located above said base mandrel structure, said base mandrel structure having a lateral width that is greater than a lateral width of said fin mandrel structure;

forming upper sidewall spacers adjacent substantially vertically oriented sidewalls of said fin mandrel structure and lower sidewall spacers adjacent substantially vertically oriented sidewalls of said base mandrel structure;

forming a sacrificial material layer above said inverted, generally T-shaped mandrel feature, said sacrificial material layer having a substantially planar upper surface that is positioned such that an upper surface of said fin mandrel structure and an upper surface of said upper sidewall spacers are exposed;

forming a patterned etch mask above said sacrificial material layer, said patterned etch mask having an opening that exposes at least a portion of at least one of said upper sidewall spacers;

performing an etching process through said opening in said patterned etch mask so as to remove said exposed portion of said at least one of said upper sidewall spacers;

removing said patterned etch mask;

performing at least one etching process to remove portions of said sacrificial material layer and portions of said inverted, generally T-shaped mandrel feature not covered by a sidewall spacer, wherein, after said etching process is completed, said sidewall spacers and remaining portions of said mandrel feature, collectively, define a fin pattern for a plurality of fins to be formed in said substrate; and performing at least one additional process operation to form a plurality of fins in said substrate that correspond to said fin pattern.

22. The method of claim 21, wherein said mandrel feature and said sacrificial material layer are comprised of the same material.

23. The method of claim 21, wherein said substantially vertically oriented fin mandrel structure has a uniform width throughout its height.

24. The method of claim 21, wherein said substantially vertically oriented fin mandrel structure has a stepped configuration, a first portion being wider than a second portion, said first portion being located adjacent said base mandrel structure.

25. The method of claim 21, wherein, prior to forming said inverted, generally T-shaped mandrel feature, the method comprises forming a hard mask material above said substrate, wherein the method comprises forming said inverted, generally T-shaped mandrel feature on said hard mask material.

26. The method of claim 21, wherein said forming said sacrificial material layer above said inverted, generally T-shaped mandrel feature comprises:

depositing said sacrificial material above said inverted, generally T-shaped mandrel feature and said substrate; and performing at least one polishing process that stops on said upper surface of said fin mandrel structure and said upper surface of said upper sidewall spacers.

27. The method of claim 21, wherein said performing at least one additional process operation comprises:
- performing an etching process to transfer said fin pattern to a hard mask layer positioned above said substrate so as to thereby define a patterned hard mask layer;
- removing said sidewall spacers and said remaining portions of said mandrel feature that define said fin pattern; and
- performing at least one etching process through said patterned hard mask layer to define a plurality of fins in said substrate that have a pattern corresponding to said fin pattern.

28. The method of claim 21, wherein said performing at least one additional process operation comprises:
- performing at least one etching process through said sidewall spacers and said remaining portions of said mandrel feature that collectively define said fin pattern so as to pattern a hard mask layer positioned above said substrate and to define a plurality of fins in said substrate that have a pattern corresponding to said fin pattern; and
- after defining said fins, removing said sidewall spacers and said remaining portions of said mandrel feature that define said fin pattern.

29. The method of claim 21, wherein said forming said inverted, generally T-shaped mandrel feature above a semiconductor substrate comprises:
- forming a first layer of mandrel material above said substrate;
- etching a plurality of trenches into said first layer of mandrel material so as to define an initial fin structure having an initial height;
- forming sacrificial spacers adjacent sidewalls of said initial fin structure;
- etching said first layer of mandrel material with said sacrificial spacers in position so as to reduce said initial height of said initial fin structure and thereby define said substantially vertically oriented fin mandrel structure and to pattern said first layer of mandrel material so as to define said base mandrel structure.

* * * * *